United States Patent
Kanda et al.

(10) Patent No.: US 8,760,905 B2
(45) Date of Patent: Jun. 24, 2014

(54) ELECTRIC FUSE, SEMICONDUCTOR DEVICE, AND INFORMATION WRITING METHOD OF ELECTRIC FUSE

(75) Inventors: Yasuo Kanda, Kanagawa (JP); Koichi Amari, Kanagawa (JP); Shunsaku Tokitou, Kanagawa (JP); Yuji Torige, Kanagawa (JP); Takayuki Arima, Kanagawa (JP)

(73) Assignee: Sony Corporation, Tokyo (JP)

( * ) Notice: Subject to any disclaimer, the term of this patent is extended or adjusted under 35 U.S.C. 154(b) by 121 days.

(21) Appl. No.: 13/406,724

(22) Filed: Feb. 28, 2012

(65) Prior Publication Data

US 2012/0243289 A1  Sep. 27, 2012

(30) Foreign Application Priority Data

Mar. 24, 2011 (JP) ................. 2011-066255
Dec. 15, 2011 (JP) ................. 2011-274255

(51) Int. Cl.
*G11C 17/00* (2006.01)

(52) U.S. Cl.
USPC ............... 365/96; 365/225.7; 365/230.06

(58) Field of Classification Search
USPC .......... 365/51, 63, 96, 225.7, 230.06; 257/50, 257/529, 530
See application file for complete search history.

(56) References Cited

U.S. PATENT DOCUMENTS

| | | | |
|---|---|---|---|
| 6,323,535 B1 * | 11/2001 | Iyer et al. | 257/529 |
| 7,368,801 B2 * | 5/2008 | Otsuka et al. | 257/529 |
| 7,485,944 B2 * | 2/2009 | Kothandaraman et al. | 257/529 |
| 7,674,691 B2 * | 3/2010 | Cestero et al. | 438/467 |
| 8,026,573 B2 * | 9/2011 | Kuo et al. | 257/529 |
| 8,361,887 B2 * | 1/2013 | Cestero et al. | 438/467 |
| 8,471,354 B2 * | 6/2013 | Kim et al. | 257/529 |

FOREIGN PATENT DOCUMENTS

JP  2006-253353  9/2006

* cited by examiner

*Primary Examiner* — Gene Auduong
(74) *Attorney, Agent, or Firm* — Dentons US LLP

(57) ABSTRACT

An electric fuse includes: a filament having a first conductive layer and a second conductive layer formed on the first conductive layer, wherein at least three discernible resistive states are generated in the filament by changing of a combination of a state of the first conductive layer and a state of the second conductive layer.

15 Claims, 12 Drawing Sheets

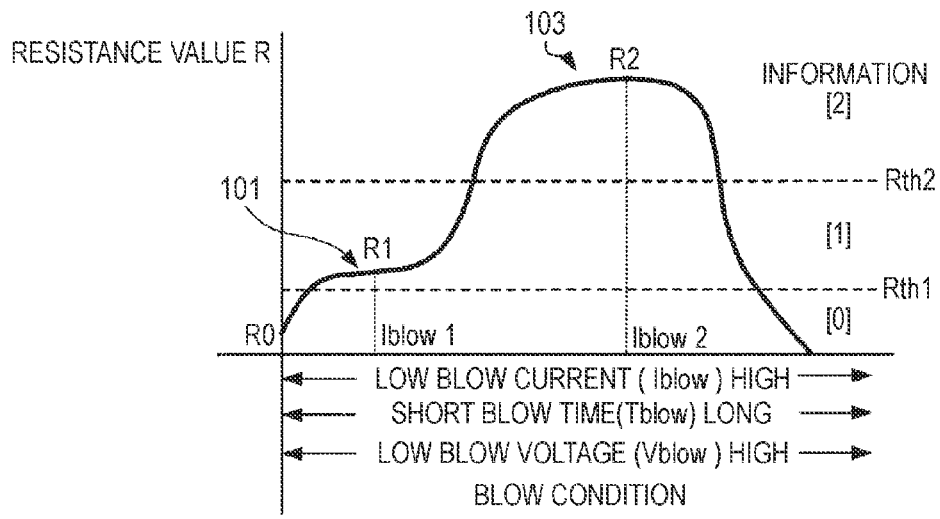

ELECTRIC FUSE, SEMICONDUCTOR DEVICE, AND INFORMATION WRITING METHOD OF ELECTRIC FUSE

FIELD

The present disclosure relates to an electric fuse, for example, mounted on a chip of a semiconductor integrated circuit or the like, a semiconductor device including the same, and an information writing method of the electric fuse.

BACKGROUND

In the related art, for example, the electric fuse is mounted on the chip of a semiconductor integrated circuit or the like used in a semiconductor device. The electric fuse is used as a trimming element for adjusting (correcting) characteristics, for example, such as the performance and power consumption of the semiconductor device.

In the electric fuse, a predetermined electric current is caused to flow through a filament thereof, thereby generating a salicide EM (Electro Migration) or Si melting in the filament. As a result, the resistance value of the filament is increased to write (program) information on the electric fuse. Specifically, the resistance value of the filament of the state before the electric current supply is recorded on the electric fuse as information "0", and the resistance value of the filament after the electric current supply is recorded on the electric fuse as information "1".

Furthermore, in an electric fuse module of the related art, a technique for performing multi-value recording of information is also suggested (for example, see JP-A-2006-253353). FIG. 21 shows a circuit configuration of the electric fuse module suggested in JP-A-2006-253353.

The electric fuse module 200 of JP-A-2006-253353 includes two electric fuses 212 and 213 having different program characteristics, a switching device 214 for program controlling, a switching device 215 for reading, and three differential amplifiers 216, 217, and 218. One end of each of the two electric fuses 212 and 213 is connected to external power source voltage terminals 210 and 211, respectively, and the other ends thereof are commonly connected to each other. Furthermore, the switching device 214 for program controlling and the switching device 215 for reading are connected in parallel between common connection nodes of the two electric fuses 212 and 213 and a ground terminal. Moreover, three differential amplifiers 216, 217, and 218 detect the voltage level of the common connection node based on reference voltages 219, 220, and 221, respectively.

In the electric fuse module 200 of JP-A-2006-253353, by changing the timing during which the electric fuses 212 or 213 are programmed, a plurality of voltage levels of the connection node between the electric fuse and the switching device are generated. In this way, in the electric fuse module 200 of JP-A-2006-253353, the multi-value information is realized by a minimum circuit size.

SUMMARY

However, recently, for example, along with a high performance logic circuit there is a necessity for an increase in capacity of the electric fuse mounted on, for example, a chip of a semiconductor integrated circuit or the like. Thus, in the technical field, a development of technology is desired, which is able to effectively increase the capacity of the electric fuse mounted on the chip in a space saving manner.

It is therefore desirable to provide an electric fuse which is able to effectively increase the capacity of the electric fuse mounted, for example, on the chip of a semiconductor integrated circuit or the like, in a space saving manner, a semiconductor device including the same, and an information writing method of the electric fuse.

An embodiment of the present disclosure is directed to an electric fuse including a filament that has a first conductive layer and a second conductive layer formed on the first conductive layer. Moreover, the filament is configured such that at least three discernible resistive states are generated by changing a combination of the state of the first conductive layer and the state of the second conductive layer.

Another embodiment of the present disclosure is directed to a semiconductor device including an electric fuse, a writing section, a reading section, a threshold value signal generating section, and a discrimination section, and functions of the respective sections are as below. The electric fuse has a filament including a first conductive layer and a second conductive layer formed on the first conductive layer in which at least three discernible resistive states are generated by changing a combination of the state of the first conductive layer and the state of the second conductive layer. The writing section generates at least three discernible resistive states for the electric fuse. The reading section reads a signal concerning the resistance value of the electric fuse. The threshold value signal generating section generates a threshold value signal for discriminating the resistive state of the electric fuse. Moreover, the discrimination section compares a signal concerning the resistance value of the filament read by the reading section to a threshold value signal generated in the threshold value signal generating section, and discriminates the resistive state of the electric fuse.

Still another embodiment of the present disclosure is directed to a semiconductor device including an electric fuse having a filament which includes a first conductive layer and a second conductive layer provided on the first conductive layer, and a writing section. Moreover, the writing section applies a plurality of electric stresses to the filament, and independently changes each resistance value of the first conductive layer and the second conductive layer.

Yet another embodiment of the present disclosure is directed to an information writing method of an electric fuse. The method is a method for writing information to the electric fuse according to the embodiment of the present disclosure, and is performed in the order below. Firstly, a blow condition for generating a predetermined resistive state is set for the electric fuse. Then, electric current is caused to flow through the filament under the set blow condition, and a predetermined resistive state is generated in the filament.

Still yet another embodiment of the present disclosure is directed to an information writing method of an electric fuse which has a filament including a first conductive layer and a second conductive layer provided on the first conductive layer. In the information writing method of the electric fuse according to this embodiment of the present disclosure, a first electric stress is applied to the filament to change the resistance value of the second conductive layer, or a second electric stress greater than the first electric stress is applied to the filament to change the resistance value of the first conductive layer.

As described above, the electric fuse according to the embodiment of the present disclosure is configured such that at least three discernible resistive states are generated in the filament by changing a combination of a state of the first conductive layer and a state of the second conductive layer. That is, in the electric fuse according to the embodiment of the present disclosure, the semiconductor device including the same, and the information writing method of the electric fuse, it is possible to perform the multi-value recording of information having at least three values on one electric fuse. Thus, according to the embodiment of the present disclosure, since the information amount recordable for each electric fuse can be increased, it is possible to effectively increase the capacity of the electric fuse mounted, for example, on the chip of the semiconductor integrated circuit or the like in a space saving manner.

BRIEF DESCRIPTION OF THE DRAWINGS

FIG. 6 is a diagram for describing a method of performing multi-value recording of information on the electric fuse;

FIG. 7 is a diagram that shows irregularity characteristics of a resistance value of the filament in the salicide EM state and the polysilicon damage state;

FIG. 8 is a diagram that shows a configuration example of a writing circuit for writing information on the electric fuse;

DETAILED DESCRIPTION

Hereinafter, an example of the electric fuse according to various embodiments of the present disclosure, the semiconductor device including the same, and the information writing method of the electric fuse will be described in a sequence as below with reference to the drawings. However, the present disclosure is not limited to the examples given below.

1. Configuration Example of Electric Fuse According to the First Embodiment
2. Principle of Multi-Value Method of Resistive State
3. Configuration Example of Semiconductor Device
4. Information Writing Method onto Electric Fuse
5. Information Reading Method of Electric Fuse
6. Information Rewriting Method of Electric Fuse
7. Various Modified Examples
8. Configuration Example of Electric Fuse According to the Second Embodiment 1. Configuration Example of Electric Fuse According to the First Embodiment Firstly, before describing a configuration of an electric fuse according to the first embodiment of the present disclosure, a problem will be briefly described which can occur, for example, when increasing the capacity of the electric fuse mounted on the chip of a semiconductor integrated circuit or the like.

For example, as a simple method of increasing the capacity of the electric fuse mounted on the chip of a semiconductor integrated circuit or the like, a method of increasing the number of the electric fuse to be mounted (the mounting capacity) is considered. Generally, since a plurality of electric fuses having the same filament shape are mounted on the chip, in this case, an area where the electric fuse occupies in the chip, is increased. Thus, when increasing the capacity of the electric fuse to be mounted on the chip by the method, the chip size is increased.

Furthermore, another method, for example, a method of shrinking the electric fuse by the refinement of the process, and a method of performing the multi-value writing of the electric fuse by the use of a technique, for example, such as MONOS (Metal-Oxide-Nitride-Oxide-Silicon) are considered. However, in such methods, it is necessary to change the process of the related art and newly add the process, which becomes a factor of an increase in cost.

In addition, in the case of applying the technique described in JP-A-2006-253353 as a method of performing the multi-value writing of the electric fuse, since a plurality of filaments are used in one fuse module, in this case, there is also a problem of an increase in area. In addition, since the technique described in JP-A-2006-253353 is a method of reading the plurality of resistance values in parallel, it is difficult to accurately read a resistance value change of the electric fuse.

Figure 1:
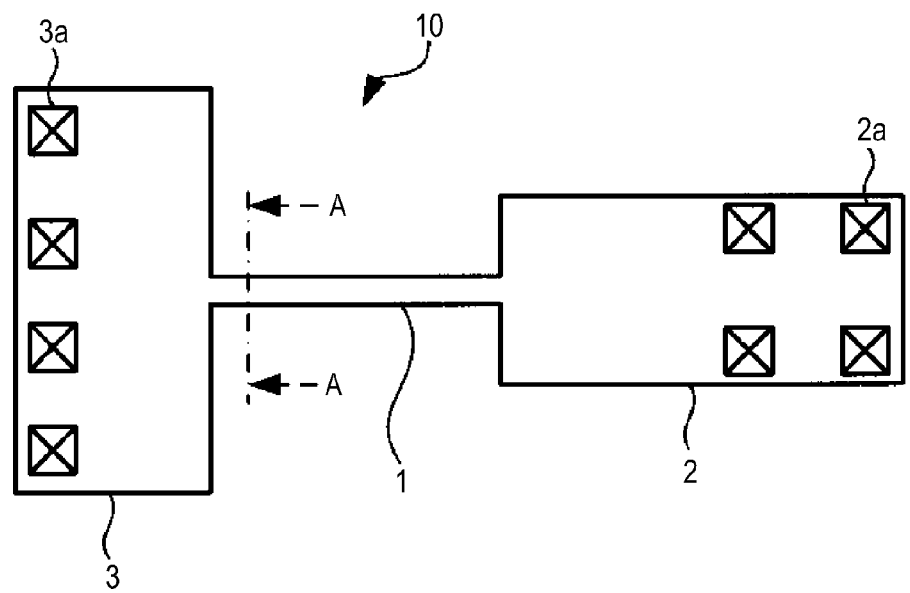
FIG. 1 is a schematic top view of an electric fuse according to a first embodiment of the present disclosure.
Figure 2:
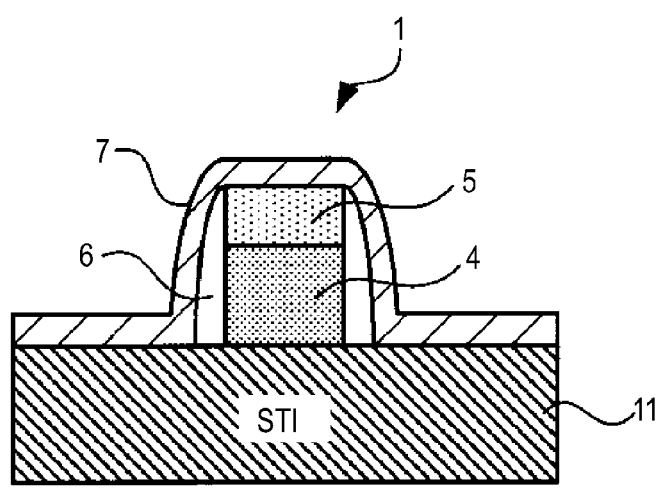
FIG. 2 is a schematic cross-sectional view of the electric fuse according to the first embodiment of the present disclosure.

Thus, in the present embodiment, one configuration example of the electric fuse capable of solving the various problems mentioned above is suggested. FIG. 1 shows a schematic top view of the electric fuse according to the present embodiment. Furthermore, FIG. 2 shows a cross-sectional view along line A-A in the electric fuse 10 shown in FIG. 1 (a schematic cross-sectional view of a filament 1). In addition, FIGS. 1 and 2 show a layout of the electric fuse 10 of one cell.

As shown in FIG. 1, the electric fuse 10 includes the filament 1, an anode 2 provided in one end portion of the filament 1, and a cathode 3 provided in the other end portion of the filament 1.

As shown in FIG. 2, the filament 1 is formed on a device separation region 11 (STI: Shadow Trench Isolation) formed on a Si substrate (not shown). Moreover, the filament 1 includes a polysilicon layer 4 (a first conductive layer, and a first electrification layer) formed on the device separation region 11, and a silicide layer 5 (a second conductive layer, and a second electrification layer) formed on the polysilicon layer 4. In addition, the polysilicon layer 4 is formed of a film having crystallization in an initial state.

Furthermore, in the present embodiment, the filament 1 is formed so as to be extended in a linear shape from the anode 2 to the cathode 3, and the width and the thickness of the filament 1 in a direction (hereinafter, referred to as the width direction) perpendicular to the extending direction are approximately uniform in the extending direction. However, the electric fuse 10 of the present embodiment can be manufactured by the same process as that of the related art.

The anode 2 is formed of an electrode film having a rectangular film surface shape, and a long side portion thereof is extended in a direction along the extending direction of the filament 1. Furthermore, for example, a plurality of contacts 2a formed of a via (pit wiring) or the like are connected to the anode 2, and the anode 2 is electrically connected to a wiring layer (an external wiring) (not shown in FIG. 1) via the contact 2a.

In addition, in the example shown in FIG. 1, the film surface shape of the anode 2 is of a rectangular form, but the present disclosure is not limited thereto. The film surface shape of the anode 2 can be arbitrarily set, for example, depending on the size, the number or the like of the forming region of the electric fuse 10. Furthermore, FIG. 1 shows an example in which four contacts 2a are connected to the anode 2 and the four contacts 2a are placed in the form of two rows×two columns, but the present disclosure is not limited thereto. The number of contacts 2a and/or the arrangement form of the contacts 2a provided in the electric fuse 10 of one cell, can be arbitrarily set, for example, depending on the configuration of the wiring layer, the size of the forming region of the electric fuse 10 or the like.

The cathode 3 is formed of an electrode film having a rectangular film surface shape, and a long side portion thereof is extended in a direction along the width direction of the filament 1. Furthermore, for example, a plurality of contacts 3a formed of a via (a pit wiring) or the like are connected to the cathode 3, and the cathode 3 is electrically connected to a wiring layer (not shown in FIG. 1) via the contact 3a.

In addition, in the example shown in FIG. 1, the film surface shape of the cathode 3 is rectangular, but the present disclosure is not limited thereto. The film surface shape of the cathode 3 can be arbitrarily set, for example, depending on the size, the number or the like of the forming region of the electric fuse 10. Furthermore, the example shown in FIG. 1 shows an example in which four contacts 3a are connected to the cathode 3 and the four contacts 3a are placed in a row at equal distances along the long side direction of the cathode 3, but the present disclosure is not limited thereto. The number of contacts 3a and/or the arrangement form of the contacts 3a provided in the electric fuse 10 of one cell can be arbitrarily set, for example, depending on the configuration of the wiring layer, the size of the forming region of the electric fuse 10 or the like.

Furthermore, as shown in FIG. 2, in the electric fuse 10 of the present embodiment, a side wall 6, for example, formed of an oxide film, a nitride film or the like is provided at a side of each layer constituting the filament 1. In addition, in an example shown in FIG. 2, on the surfaces of the silicide layer 5, the side wall 6, and the device separation region 11, a protective film 7 (an insulating film) is provided. In addition, the configuration of the filament 1 is not limited to the example shown in FIG. 2, but a configuration may be adopted which includes at least the polysilicon layer 4 and the silicide layer 5, and the filament 1 may be constituted only by the polysilicon layer 4 and the silicide layer 5.

2. Principle of Multi-Value Method of Resistive State

In the electric fuse 10 of the present embodiment, at least three discernible resistive states are generated in the filament 1, and the respective resistive states are associated with different information (for example, information "0", "1", "2" or the like), respectively, to perform the multi-value recording. In addition, in the present embodiment, the electric current is caused to flow through the electric fuse to write information, but, hereinafter, the writing operation is also called a "blow".

(1) Resistance Change Characteristics of Filament

Figure 3:
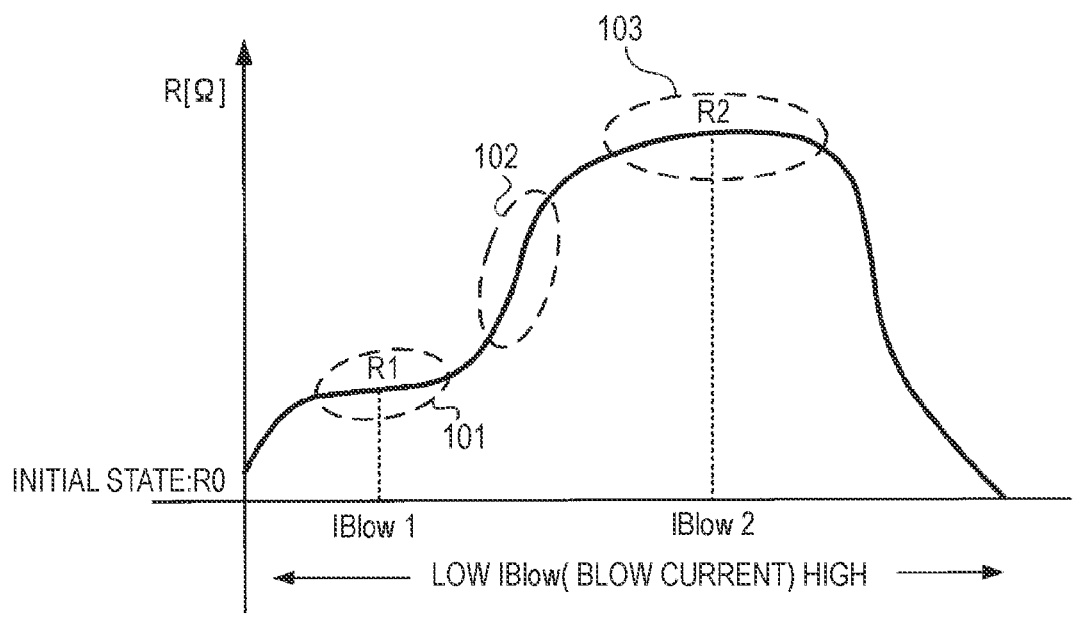
FIG. 3 is a diagram that shows change characteristics of a resistance value of the electric fuse to a blow electric current.

In the present embodiment, by causing the electric current to flow through the electric fuse 10 and suitably changing the blow condition when writing information, the multi-value recording of information is performed on the electric fuse 10. Herein, FIG. 3 shows the relationship of the resistance value R of the filament 1 in the electric fuse 10 of the configuration described in FIGS. 1 and 2 and the electric current (hereinafter, referred to as a blow electric current Iblow) flowing in the filament 1. In addition, the horizontal axis of the characteristics shown in FIG. 3 is the blow electric current Iblow, and the vertical axis thereof is the resistance value R of the filament 1.

When causing the electric current Iblow to flow through the filament 1 that is in its initial state (resistance value R0), the filament 1 is heated, and, as shown in FIG. 3, the resistance value R is increased from the resistance value R0 of the initial state. In addition, in the electric fuse 10 of the configuration of the present embodiment, the resistance value R0 of the initial state of the filament 1 is about 500Ω.

After that, when further increasing the blow electric current Iblow to approach a first blow electric current Iblow1, the resistance value R of the filament 1 begins to become saturated. Moreover, in a region (hereinafter, referred to as a first saturation region 101) near the first blow electric current Iblow1, the resistance value R is saturated, whereby it is possible to obtain an approximately uniform resistance value R1 regardless of the blow electric current Iblow. In addition, the resistance value R1 of the filament 1 in the first saturation region 101 is in the order of thousands of Ωs.

Figure 4A:
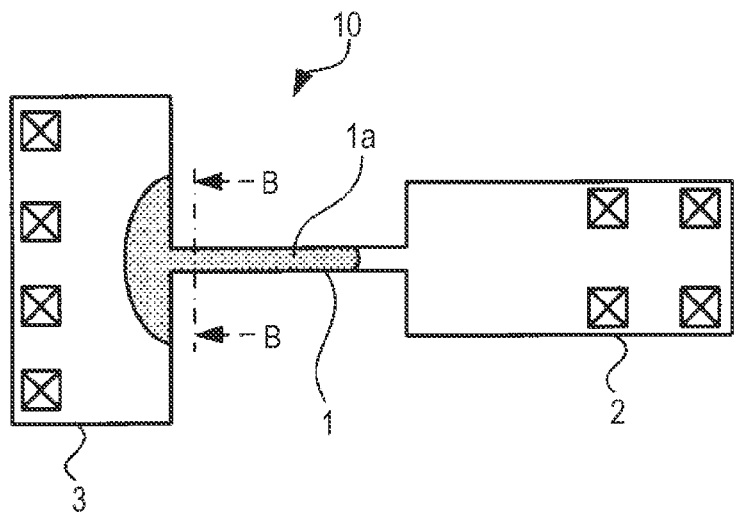
FIGS. 4A and 4B are diagrams that show a filament when a salicide EM is generated in the filament.
Figure 4B:
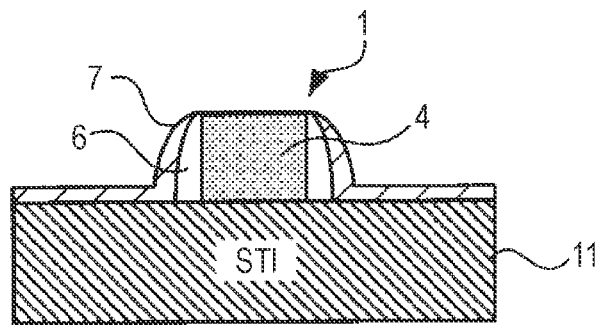

In the first saturation region 101, a state is obtained where a salicide EM is generated in the filament 1 (hereinafter, simply referred to as a salicide EM state). FIGS. 4A and 4B show the state of the filament 1 when the filament 1 is in the salicide EM state. In addition, FIG. 4A is a schematic top view of the filament 1, and FIG. 4B is a cross-sectional view of line B-B of FIG. 4A.

A filament region 1a, indicated by hatching of FIG. 4A, is a region where the salicide EM is generated. In the filament region 1a where the salicide EM is generated, as shown in FIG. 4B, the silicide layer 5 is dissolved and disappeared. That is, the filament 1 is formed only by the polysilicon layer 4. In the filament 1 of such a state, even when causing the blow electric current Iblow near the first blow electric current Iblow1 to flow, the polysilicon layer 4 is not damaged. Thus, in the region near the first blow electric current Iblow1, the resistance value R is saturated, whereby, an approximately uniform resistance value R1 (in the order of thousands of Ωs) is obtained.

Next, when further increasing the blow electric current Iblow from the salicide EM state, the polysilicon layer 4 begins to melt, and the resistance value R of the filament 1 is sharply increased (a Si melting region 102 in FIG. 3).

After that, when further increasing the blow electric current Iblow to approach a second blow electric current Iblow2, the resistance value R of the filament 1 begins to become saturated again. Moreover, the resistance value R is saturated in a region (hereinafter, referred to as a second saturation region 103) near the second blow electric current Iblow2, whereby an approximately uniform resistance value R2 is obtained regardless of the blow electric current Iblow. In addition, the resistance value R2 of the filament 1 in the second saturation region 103 is in the order of tens of thousands Ωs.

Figure 5A:
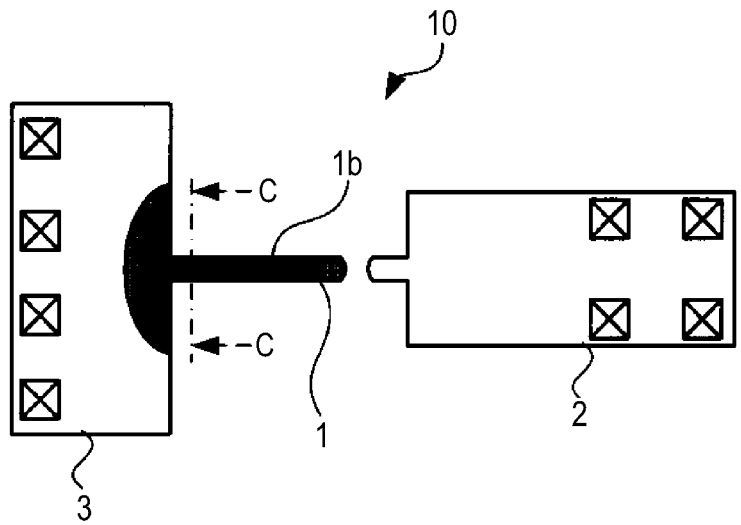
FIGS. 5A and 5B are diagrams that show shapes of the filament when polysilicon damage is generated in the filament.
Figure 5B:
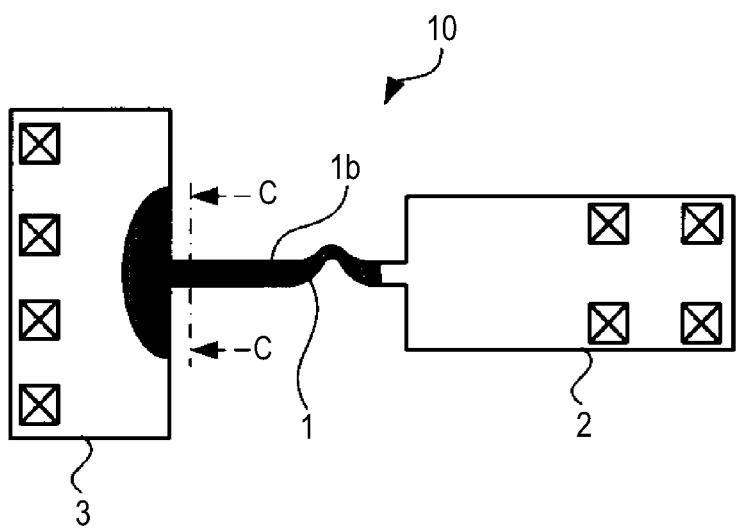
Figure 5C:
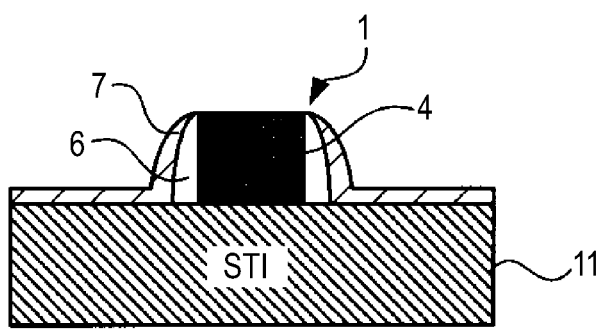

In the second saturation region 103, the polysilicon layer 4 in the filament 1 is damaged, and the crystal structure thereof is changed to an amorphous state. Hereinafter, such a state is called a polysilicon damage state. Furthermore, in the second saturation region 103, for example, a part of the filament 1 is cut or a part of the filament 1 is bent. An example of such a state is shown in FIGS. 5A to 5C. FIG. 5A is a schematic top view of the filament 1 that is in the polysilicon damage state, and shows the situation in which the filament 1 is cut in the middle portion thereof. Furthermore, FIG. 5B is a schematic top view of the filament 1 that is in the polysilicon damage state, and shows the situation in which a part of the filament 1 is bent. In addition, FIG. 5C is a cross-section view of a line C-C of FIGS. 5A and 5B. In the second saturation region 103, the polysilicon layer 4 in the filament 1 enters the amorphous state.

When the state of the filament 1 enters the polysilicon damage state shown in FIGS. 5A to 5C, even if the blow electric current Iblow near the second blow electric current Iblow2 is caused to flow through the filament 1, the state of the filament 1 is nearly unchanged. Thus, in the region near the second blow electric current Iblow2, the saturation value R is saturated, whereby an approximately uniform resistance value R2 (tens of thousands Ω) is obtained.

(2) Principle of Multi-Value Recording

As mentioned above, the filament 1 has two saturation regions of the resistance value R in the change characteristics of the resistance value R to the blow electric current Iblow, and has a property that a difference in resistance value between two saturation regions also has a magnitude to the extent that both regions can be identified. In the present embodiment, the multi-value recording of information is performed on the electric fuse 10 by the use of the property of the change characteristics of the resistance value R of the filament 1. Specifically, multi-value recording is performed by causing different pieces of information to respond to the three states (the resistive states) of the filament 1: the initial state, the salicide EM state, and the polysilicon damage state, respectively.

FIG. 6 shows a summary of a principle of the multi-value recording of information in the electric fuse 10 of the present embodiment. FIG. 6 shows change characteristics of the resistance value R of the filament 1 to the blow condition of the electric fuse 10, the horizontal axis thereof is the blow condition (the blow electric current Iblow, a blow voltage Vblow and a blow time Tblow described later), and the vertical axis thereof is the resistance value R of the filament 1. In addition, as described later, in the present embodiment, the blow electric current Iblow is changed by changing the combination (the blow condition) of the blow voltage Vblow and the blow time Tblow.

In the present embodiment, two threshold values (hereinafter, referred to as a first threshold value Rth1 and a second threshold value Rth2) are set for the resistance value R of the filament 1. As shown in FIG. 6, the first threshold value Rth1 is set to a value between the resistance value R0 of the initial state (before the blow) of the filament 1 and the resistance value (near R1) of the first saturation region 101 (the salicide EM state). Furthermore, the second threshold value Rth2 is set to a value between the resistance value (near R1) of the first saturation region 101 (the salicide EM state) and the resistance value (near R2) of the second saturation region 103 (the polysilicon damage state).

In addition, in the present embodiment, the resistance value R0 of the initial state is about 500Ω, and the resistance value (near R1) of the first saturation region 101 (the salicide EM state) is in the order of thousands of Ωs. Thus, for example, the first threshold value Rth1 can be set to the value of about 1,000Ω. Furthermore, in the present embodiment, since the resistance value (near R2) of the second saturation state 103 (the polysilicon damage state) is in the order of tens of thousands of Ωs, for example, the second threshold value Rth2 can be set to the value of about 5,000Ω. By setting the first threshold value Rth1 and the second threshold value Rth2 to the values mentioned above, it is possible to identify that the resistive state of the filament 1 is which one of the initial state, the salicide EM state, or the polysilicon damage state.

Moreover, in the present embodiment, when the resistance value R of the filament 1 is a value between the resistance value R0 of the initial state and the first threshold value Rth1, the resistive state of the filament 1 is assigned to information "0". Furthermore, when the resistance value R of the filament 1 is a value between the first threshold value Rth1 and the second threshold value Rth2, the resistive state of the filament 1 is assigned to information "1". In addition, when the resistance value R of the filament 1 exceeds the second threshold value Rth2, the resistive state of the filament 1 is assigned to information "2".

Accordingly, when the filament 1 is set to the initial state (resistance value R0), information recorded in the electric fuse 10 becomes "0". Furthermore, when the filament 1 is set to the salicide EM state (near the resistance value R1), information recorded in the electric fuse 10 becomes "1". Moreover, when the filament 1 is set to the polysilicon damage state (near the resistance value R2), information recorded in the electric fuse 10 becomes "2". To summarize the relationship between the states of the filament 1 (the resistive state) and the recording information, Table 1 is obtained as below.

TABLE 1

| Information | Resistance Value R (Ω) | Resistive State |
|---|---|---|
| 0 | 500 | initial |
| 1 | thousands | salicide EM |
| 2 | tens of thousands | polysilicon damage |

As described above, in the present embodiment, three-value recording of information can be performed by setting the resistance value R of the filament 1 to any one of the resistance value R0 of the initial state, the resistance value R1 of the salicide EM state, and the resistance value R2 of the polysilicon damage state. That is, in the present embodiment, the multi-value recording of information can be performed by changing the combination of the state of the polysilicon layer 4 and the state of the silicide layer 5 constituting the filament 1 and setting the resistive state of the filament 1 to anyone of the three states mentioned above.

In addition, generally, even when setting the first blow electric current Iblow1 for setting the filament 1 to the salicide EM state at a predetermined value and causing the same to flow through the filament 1, irregularity is generated in the resistance value R1 thereof for each filament 1. Furthermore, even when setting the second blow electric current Iblow2 for setting the filament 1 to the polysilicon damage state at a predetermined value and causing the same to flow through the filament 1, irregularity is similarly generated in the resistance value R2 thereof for each filament 1.

FIG. 7 shows the irregularity characteristics of the resistance value R of the filament 1 in the salicide EM state and the polysilicon damage state. In addition, the horizontal axis of irregularity characteristics shown in FIG. 7 is the resistance value R of the filament 1, and the vertical axis thereof is an irregularity amount σ of the resistance value R. Furthermore, characteristics of the dotted-line in FIG. 7 are irregularity characteristics of the resistance value R1 of the filament 1 in the salicide EM state, and characteristics of the solid line are irregularity characteristics of the resistance value R2 of the filament 1 in the polysilicon damage state.

As shown in FIG. 7, even when setting the first blow electric current Iblow1 and the second blow electric current Iblow2 flowing the in the electric fuse 10 to a predetermined value, respectively, irregularities are generated in the resistance values R1 and R2 of the filament 1. Thus, the first threshold value Rth1 and the second threshold value Rth2 are suitably set in view of the irregularities of the resistance values R1 and R2 of the filament 1.

(3) An Example of an Information Writing Circuit

Next, an example of an information writing circuit for setting the resistive state of the filament 1 to any one of the initial state, the salicide EM state, and the polysilicon damage state will be described.

FIG. 8 shows the writing circuit for writing (changing the resistive state) information on the electric fuse 10 by blowing the filament 1 (applying electric stress to the filament 1). In addition, FIG. 8 shows a configuration of the writing circuit to the electric fuse 10 of one cell.

A writing circuit 20 (the writing section) has a blow transistor 21 including an N type MOS (Metal Oxide Semiconductor) transistor. A drain of the blow transistor 21 is connected to the cathode 3 of the electric fuse 10, and a source of the blow transistor 21 is grounded. Furthermore, a gate of the blow transistor 21 is connected to a supplying terminal of the blow voltage Vblow.

The blow transistor 21 enters an ON state when the blow voltage Vblow is applied to the gate. Thus, when blowing the filament 1 (causing the blow electric current Iblow to flow), the blow voltage Vblow is applied to the gate of the blow transistor 21. In addition, the magnitude of the blow electric current Iblow is changed by the electric potential difference between the gate and the source of the blow transistor 21, that is, the blow voltage Vblow applied to the gate, in the present example.

Specifically, upon raising the blow voltage Vblow, the blow electric current Iblow is increased.

In the present embodiment, when writing information on the electric fuse 10, the magnitude of the blow electric current Iblow flowing in the filament 1 and the electric current supplying time are changed by changing the blow condition, thereby changing the resistive state (the resistance value R) of the filament 1. Specifically, in the present embodiment, the blow electric current Iblow is changed by changing the combination of the blow voltage Vblow applied to the gate of the blow transistor 21 and an application time (hereinafter, called the blow time Tblow) of the blow voltage Vblow.

Figure 9:
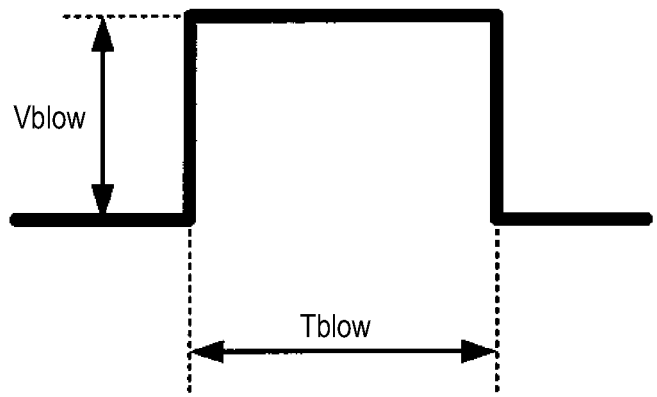
FIG. 9 is a signal waveform example of a blow voltage that is applied to a gate of a blow transistor.

FIG. 9 shows a signal waveform example of the blow voltage Vblow applied to the blow transistor 21. In the present embodiment, the pulsed blow voltage Vblow shown in FIG. 9 is applied to the gate terminal of the blow transistor 21. In this case, during blow time Tblow, the blow transistor 21 enters the ON state, and the filament 1 is supplied with the blow electric current Iblow corresponding to the blow voltage Vblow.

In the case of writing information "1" on the electric fuse 10 by the use of the writing circuit 20 shown in FIG. 8, the blow condition is set such that the salicide EM is generated in the filament 1 (a first blow condition: a blow condition for applying a first electric stress to the filament 1). Specifically, for example, the blow voltage Vblow is relatively low, and the blow time Tblow is relatively short. Furthermore, in the case of writing information "2" on the electric fuse 10, the blow condition is set such that the resistive state of the filament 1 becomes the polysilicon damage state (a second blow condition: a blow condition for applying a second electric stress to the filament 1). Specifically, for example, as compared to the first blow condition, the blow voltage Vblow is high, and the blow time Tblow is long. In addition, in the case of recording information "0" on the electric fuse 10, the filament is not blown.

3. Configuration Example of Semiconductor Device

Figure 10:
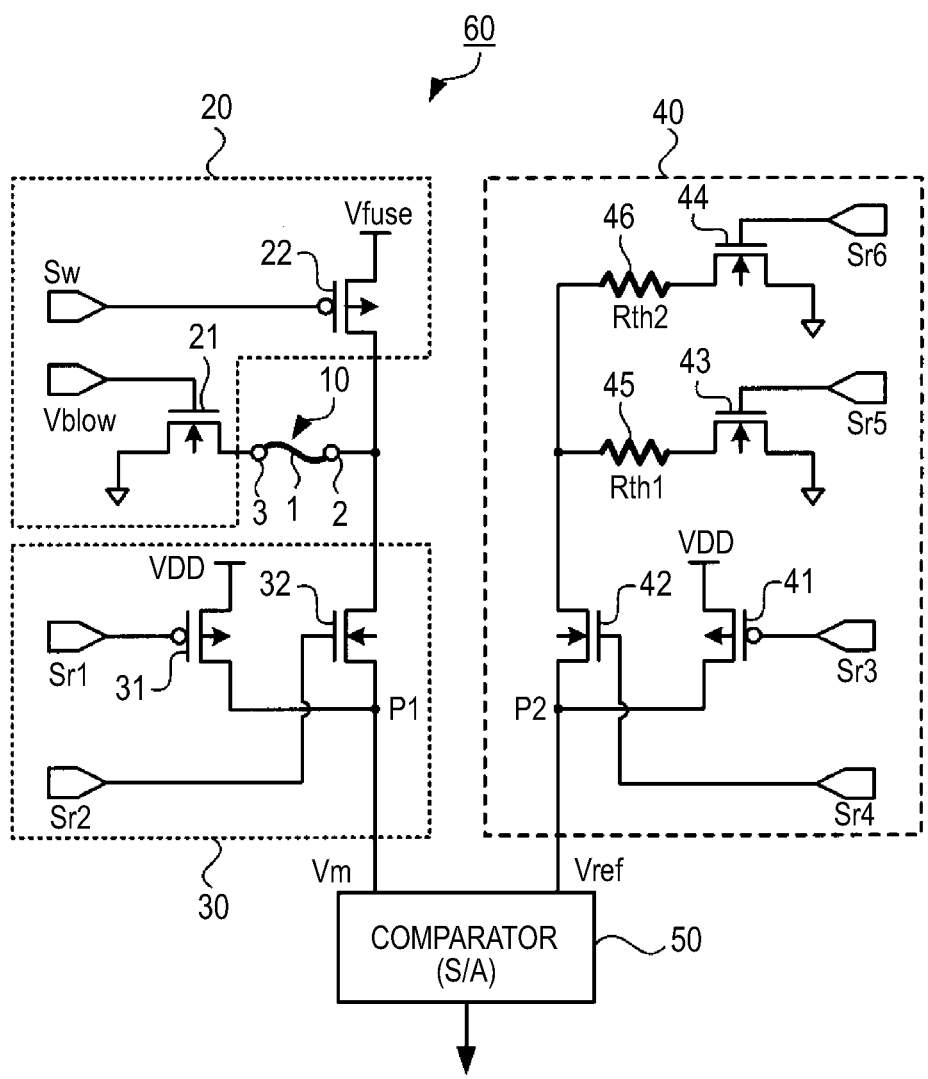
FIG. 10 is a schematic configuration diagram of a semiconductor device which includes the electric fuse according to the first embodiment of the present disclosure.

Next, an example of a semiconductor device, for example, such as a solid-state imaging device including the electric fuse 10 of the present embodiment mentioned above will be described. FIG. 10 shows a circuit configuration around the electric fuse 10 of the semiconductor device according to the present embodiment. In addition, in order to simplify the description, only the circuit section which performs the writing and the reading of information on the electric fuse 10 is shown herein.

A semiconductor device 60 includes the electric fuse 10, the writing circuit 20 (the writing section), a reading circuit 30 (the reading section), a reference signal generating circuit (a threshold value signal creating section), and a comparator 50 (a discrimination section). In addition, in the semiconductor device 60 of the present embodiment, a configuration other than the above configuration section for performing the writing and the reading of information on the electric fuse 10 can be configured similar to the semiconductor device 60 of the related art.

Furthermore, various control signals (Sw, and Sr1 to Sr6 in FIG. 10) and various voltages (Vblow, Vfuse, and VDD in FIG. 10) to be input (applied) to each circuit of the semiconductor device 60 are supplied from a control section and a power source section (both them are not shown) in the semiconductor device 60. In addition, the configuration of the electric fuse 10 is the same as those described in FIGS. 1 and 2, and thus, the description of the configuration of the electric fuse 10 will be omitted herein.

(1) Configuration of Writing Circuit

The writing circuit 20 is a circuit which performs the multi-value recording (the multi-value of the resistive state of the filament 1) of information on the electric fuse 10, and has a blow transistor 21 and a writing switch element 22. In addition, the configuration of the blow transistor 21 is the same as that described in FIG. 8, and the description of the configuration of the blow transistor 21 will be omitted herein.

The writing switch element 22 includes a P type MOS transistor, and a gate thereof is connected to an input terminal of the control signal Sw. Furthermore, a source of the writing switch element 22 is connected to a supplying terminal of the writing voltage Vfuse (high voltage of about 4.0 V) of the electric fuse 10, and a drain of the writing switch element 22 is connected to the anode 2 of the electric fuse 10. In addition, the writing switch element 22 enters the ON state when the control signal Sw of a Low level is input to the gate.

(2) Configuration of Reading Circuit

The reading circuit 30 is a circuit which reads the multi-value recorded information on the electric fuse 10, and has two reading switch elements 31 and 32 (hereinafter, referred to as a first switch element 31 and a second switch element 32, respectively).

The first switch element 31 includes a P type MOS transistor, and a gate thereof is connected to an input terminal of the control signal Sr1. Furthermore, a source of the first switch element 31 is connected to a supplying terminal of the power source voltage VDD, and a drain of the first switch element 31 is connected to a drain of the second switch element 32 and one input terminal of the comparator 50. In addition, the first switch element 31 enters the ON state when the control signal Sr1 of the Low level is input to the gate.

The second switch element 32 includes an N type MOS transistor, and a gate thereof is connected to an input terminal of the control signal Sr2. Furthermore, a source of the second switch element 32 is connected to a drain of the writing switch element 22 in the writing circuit 20 and the anode 2 of the electric fuse 10. In addition, a drain of the second switch element 32 is connected to the drain of the first switch element 31 and one input terminal of the comparator 50. In addition, the second switch element 32 enters the ON state when the control signal Sr2 of High level is input to the gate.

(3) Configuration of Reference Signal Generating Circuit

The reference signal generating circuit 40 is a circuit which generates a reference signal (a standard voltage signal) becoming the standard (the threshold value) when reading the multi-value recorded information on the electric fuse 10. The reference signal generating circuit 40 has four reference signal generating switch elements 41 to 44 (hereinafter, referred to as a third switch element 41 to a sixth switch element 44, respectively), a first reference resistance 45, and a second reference resistance 46.

The third switch element 41 includes a P type MOS transistor, and a gate thereof is connected to an input terminal of the control signal Sr3. Furthermore, a source of the third switch element 41 is connected to a supplying terminal of the power source voltage VDD, and a drain of the third switch element 41 is connected to a drain of the fourth switch element 42 and the other input terminal of the comparator 50. In addition, the third switch element 41 enters the ON state when the control signal Sr3 of the Low level is input to the gate.

The fourth switch element 42 includes an N type MOS transistor, and a gate thereof is connected to an input terminal of the control signal Sr4. Furthermore, a source of the fourth switch element 42 is connected to one terminal of the first reference resistance 45 and the second reference resistance 46, and a drain of the fourth switch element 42 is connected to the drain of the third switch element 41 and the other input terminal of the comparator 50. In addition, the fourth switch element 42 enters the ON state when the control signal Sr4 of high level is input to the gate.

The fifth switch element 43 includes an N type MOS transistor, and a gate thereof is connected to an input terminal of the control signal Sr5. Furthermore, a source of the fifth switch element 43 is grounded, and a drain of the fifth switch element 43 is connected to the other terminal of the first reference resistance 45. In addition, the fifth switch element 43 enters the ON state when the control signal Sr5 of High level is input to the gate.

The sixth switch element 44 includes the N type MOS transistor, and a gate thereof is connected to an input terminal of the control signal Sr6. Furthermore, a source of the sixth switch element 44 is grounded, and a drain of the sixth switch element 44 is connected to the other terminal of the second reference resistance 46. In addition, the sixth switch element 44 enters the ON state when the control signal Sr6 of High level is input to the gate.

The resistance value of the first reference resistance 45 includes a resistance device of the first threshold value Rth1 (a threshold value for discriminating that information recorded on the electric fuse 10 is which one of "0" and "1") shown in FIG. 6. Meanwhile, the resistance value of the second reference resistance 46 includes a resistance device of the second threshold value Rth2 (a threshold value for discriminating that information recorded on the electric fuse 10 is which one of "1" and "2") shown in FIG. 6.

(4) Configuration of Comparator

The comparator 50 includes a sense amplifier. One input terminal of the comparator 50 is connected to a connection point P1 (hereinafter, referred to as a first connection point P1) between the drain of the first switch element 31 and the drain of the second switch element 32 in the reading circuit 30. Furthermore, the other input terminal of the comparator 50 is connected to a connection point P2 (hereinafter, referred to as a second connection point P2) between the drain of the third switch element 41 and the drain of the fourth switch element 42 in the reference signal generating circuit 40.

The comparator 50 compares a voltage signal Vm (a signal concerning the resistance value R of the filament 1) of the first connection point P1 input to one input terminal to a reference voltage signal Vref (a threshold value signal) of the second connection point P2 input to the other input terminal, and outputs the comparison result thereof.

In addition, in the present embodiment, an example has been described in which various switch elements in each circuit of the semiconductor device 60 are constituted by the MOS transistor, but the present disclosure is not limited thereto. If a switch element is able to perform the same switch operation, an arbitrary switch element can be used. Furthermore, like the present embodiment, in the case of constituting various switch elements in each circuit by the MOS transistor, it is possible to suitably change a conductive type (N type or P type) and a combination thereof of each MOS transistor.

4. Information Writing Method to Electric Fuse

Figure 11:
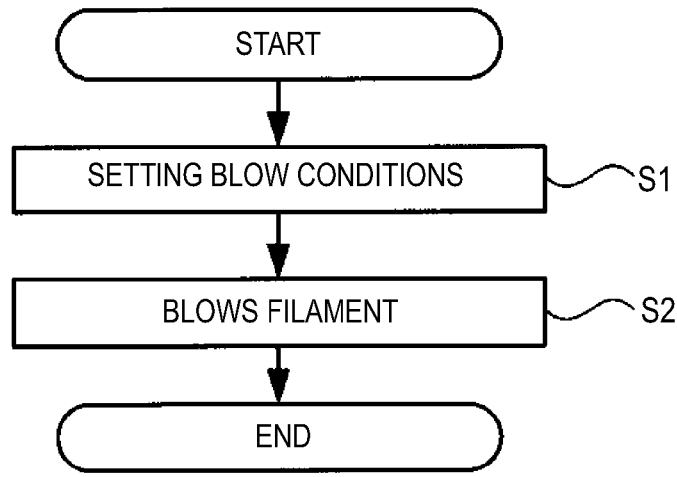
FIG. 11 is a flow chart that shows a process sequence of a writing method of information to the electric fuse.
Figure 12:
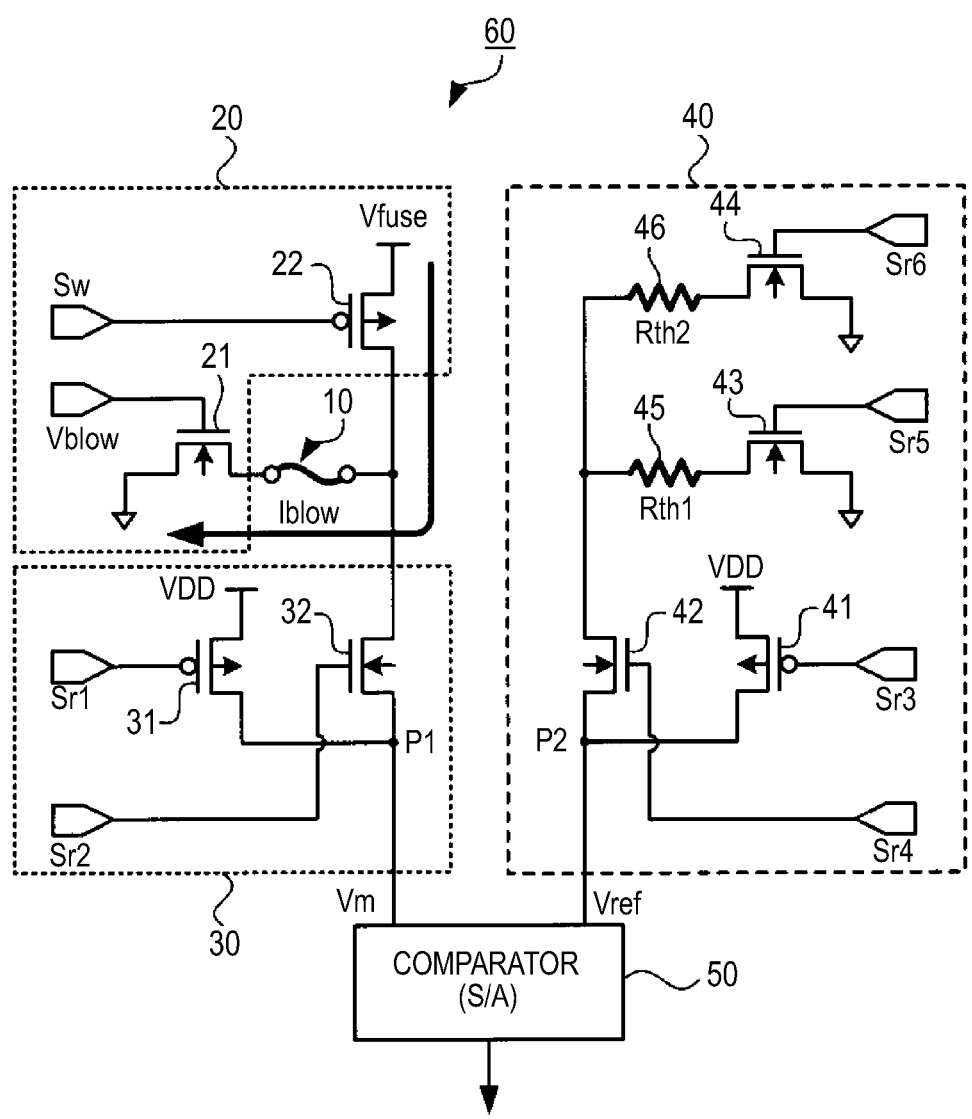
FIG. 12 is a diagram for describing the writing method of information to the electric fuse.

Next, the process of information writing to the electric fuse in the semiconductor device 60 of the present embodiment will be specifically described with reference to FIGS. 11 and 12. In addition, FIG. 11 is a flow chart that shows a process sequence of the information writing method to the electric fuse 10 in the present embodiment. Furthermore, FIG. 12 shows the operation when writing information on the electric fuse 10 in the semiconductor device 60 of the present embodiment. In addition, when writing information (when changing the resistive state of the filament 1) on the electric fuse 10, all of various switch elements in the reading circuit 30 and the reference signal generating circuit 40 enter the OFF state.

When writing information on the electric fuse 10, firstly, the semiconductor device 60 sets the blow condition (the blow voltage Vblow and/or the blow time Tblow) corresponding to information (the resistive state) recorded on the filament 1 (step S1).

Specifically, in the case of recording information "1" on the electric fuse 10, the semiconductor device 60 sets the blow condition such that the blow electric current Iblow (for example, Iblow in FIG. 6), in which the resistive state of the filament 1 becomes the salicide EM state, flows through the filament 1. Furthermore, in the case of recording information "2" on the electric fuse 10, the semiconductor device 60 sets the blow condition such that the blow electric current Iblow (for example, Iblow2 in FIG. 6), in which the resistive state of the filament 1 becomes the polysilicon damage state, flows through the filament 1.

Next, the semiconductor device 60 applies the set blow voltage Vblow to the gate of the blow transistor 21, and inputs the control signal Sw of Low level to the gate of the writing switch element 22. As a result, both of the blow transistor 21 and the writing switch element 22 enter the ON state, and as shown by a thick solid arrow in FIG. 12, a predetermined blow electric current Iblow flows through the electric fuse 10. Moreover, the semiconductor device 60 causes (blows) the blow electric current Iblow to flow through the filament 1 during the set blow time Tblow, and sets the resistive state of the filament 1 to a predetermined resistive state (step S2).

In the present embodiment, as described above, the resistive state of the filament 1 is changed (the respective resistance values of the polysilicon layer 4 and the silicide layer 5 are independently changed), and information of "1" or "2" are written on the electric fuse 10 (multi-value recording). In addition, in the case of recording information "0" on the electric fuse 10, the blow electric current Iblow is not caused to flow through the electric fuse 10 (both of the blow transistor 21 and the writing switch element 22 are turned OFF), but the resistive state of the filament 1 is kept to the initial state.

5. Information Reading Method of Electric Fuse

Figure 13:
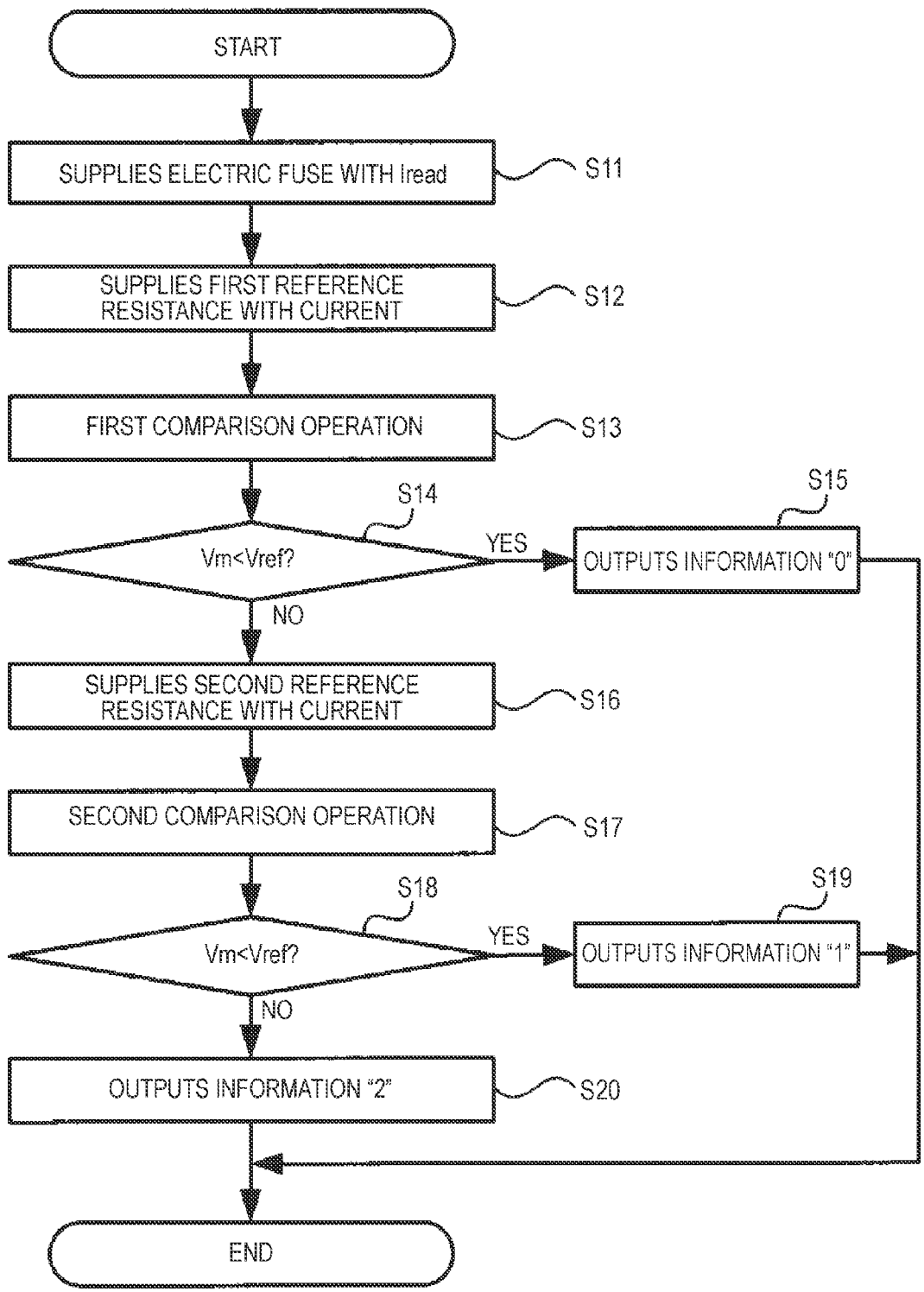
FIG. 13 is a flow chart that shows a process sequence of a reading method of information recorded on the electric fuse.
Figure 14:
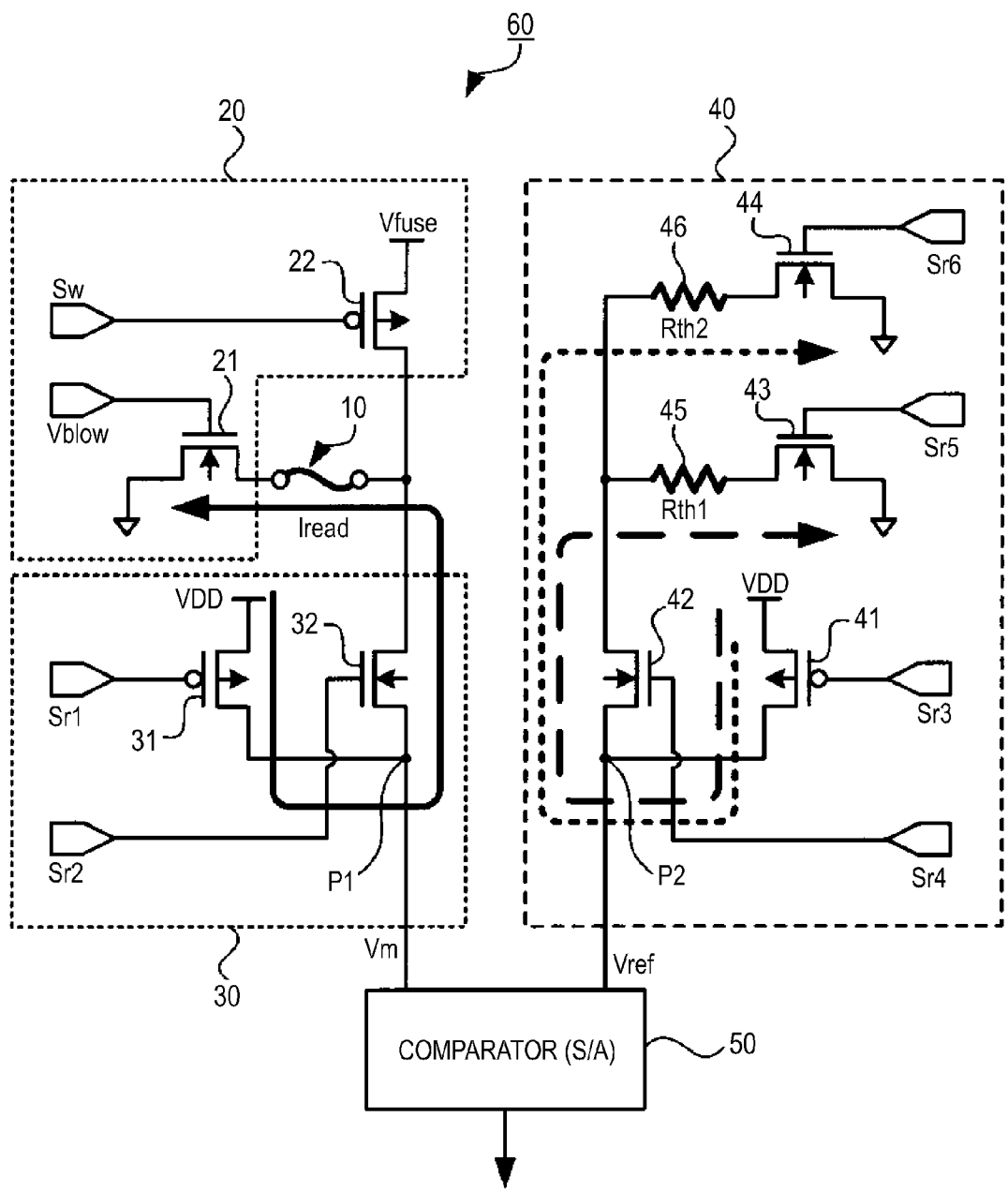
FIG. 14 is a diagram for describing the reading method of information recorded on the electric fuse.

Next, an information reading process of the electric fuse 10 in the semiconductor device 60 of the present embodiment will be specifically described with reference to FIGS. 13 and 14. In addition, FIG. 13 is a flow chart that shows a process sequence of the information reading method of the electric fuse 10 in the present embodiment. Furthermore, FIG. 14 is a diagram that shows the operation when reading information of the electric fuse 10 in the semiconductor device 60 of the present embodiment. In addition, when reading information of the electric fuse 10 (when discriminating the resistive state of the filament 1), the blow transistor 21 in the writing circuit 20 enters the ON state, and the writing switch element 22 enters the OFF state.

When reading information recorded on the electric fuse 10, firstly, the semiconductor device 60 inputs the control signal Sr1 of Low level to the gate of the first switch element 31 in the reading circuit 30, and inputs the control signal Sr2 of High level to the gate of the second switch element 32. As a result, the first switch element 31 and the second switch element 32 in the reading circuit 30 as well as the blow transistor 21 in the writing circuit 20 enter the ON state. As a consequence, as shown by a thick solid arrow in FIG. 14, a reading electric current Iread flows through the electric fuse 10 (step S11).

Moreover, the semiconductor device 60 performs the process as below in the state of causing the reading electric current Ired to flow through the electric fuse 10, and reads information recorded on the electric fuse 10.

Firstly, the semiconductor device 60 inputs the control signal Sr3 of Low level to the gate of the third switch element 41 in the reference signal generating circuit 40, and inputs the control signal Sr4 of High level to the gate of the fourth switch element 42. Furthermore, at this time, the semiconductor device 60 inputs the control signal Sr5 of High level to the gate of the fifth switch element 43 in the reference signal generating circuit 40, and inputs the control signal Sr6 of Low level to the gate of the sixth switch element 44. As a result, the third switch element 41 to the fifth switch element 43 in the reference signal generating circuit 40 enter the ON state, and the sixth switch element 44 enters the OFF state. As a consequence, as shown by a thick dotted-arrow in FIG. 14, the electric current flows through the first reference resistance 45 (step S12).

Next, in the state where the electric current flows through the first reference resistance 45, the comparator 50 compares the voltage signal Vm of the first connection point P1 in the reading circuit 30 to a voltage signal Vref of the second connection point P2 in the reference signal generating circuit 40 (hereinafter, referred to as a first comparison operation: step S13).

In addition, in the first comparison operation, in the state where the reading electric current Ired flows through the electric fuse 10, an electric potential (Vm) of the first connection point P1 becomes the electric potential corresponding to the resistance value R of the filament 1. Furthermore, in the first comparison operation, in the state where the electric current flows through the first reference resistance 45, an electric potential (Vref) of the second connection point P2 becomes an electric potential corresponding to the resistance value (Rth1) of the first reference resistance 45. Accordingly, the first comparison operation between the voltage signal Vm and the reference voltage signal Vref in the comparator 50 substantially becomes equal to an operation of comparing the resistance value R of the electric fuse 10 to the resistance value of the first reference resistance 45, that is, the first threshold value Rth1.

Next, the comparator 50 determines whether or not the voltage signal Vm of the first connection point P1 is smaller than the reference voltage signal Vref of the second connection point P2 (Vm<Vref) (step S14).

In step S14, when the voltage signal Vm is smaller than the reference voltage signal Vref (R<Rth1), YES is determined in step S14. In this case, the comparator 50 outputs the signal (the comparison result) corresponding to information "0" (step S15), and finishes the reading process of information.

Meanwhile, in step S14, when the voltage signal Vm is greater than the reference voltage signal Vref (R>Rth1), NO is determined in step S14. In this case, the comparator 50 performs the processes after step S16 described below.

Next, the semiconductor device 60 keeps the third switch element 41 and the fourth switch element 42 in the reference signal generating circuit 40 in the ON state. Moreover, the semiconductor device 60 inputs the control signal Sr5 of Low level to the gate of the fifth switch element 43 in the reference signal generating circuit 40, and inputs the control signal Sr6 of High level to the gate of the sixth switch element 44. As a result, the third switch element 41, the fourth switch element 42, and the sixth switch element 44 in the reference signal generating circuit 40 enter the ON state, and the fifth switch element 43 enter the OFF state. As a consequence, as shown by a thick dotted-arrow in FIG. 14, the electric current flows through the second reference resistance 46 (step S16).

Next, in the state where the electric current flows through the second reference resistance 46, the comparator 50 compares the voltage signal Vm of the first connection point P1 in the reading circuit 30 to the reference voltage signal Vref of the second connection point P2 in the reference signal generating circuit 40 (hereinafter, referred to as a second comparison operation: step S17).

In addition, in the second comparison operation, in the state where the electric current flows through the second reference resistance 46, an electric potential (Vref)) of the second connection point P2 becomes the electric potential corresponding to the resistance value (Rth2) of the second reference resistance 46. Accordingly, the second comparison operation between the voltage signal Vm and the reference voltage signal Vref in the comparator 50 substantially becomes equal to an operation of comparing the resistance value R of the electric fuse 10 to the resistance value of the second reference resistance 46, that is, the second threshold value Rth2.

Next, the comparator 50 determines whether or not the voltage signal Vm of the first connection point P1 is smaller than the reference voltage signal Vref of the second connection point P2 (Vm<Vref) (step S18).

In step S18, when the voltage signal Vm is smaller than the reference voltage signal Vref (R<Rth2), YES is determined in step S18. In this case, the comparator 50 outputs the signal (the comparison result) corresponding to information "1" (step S19), and finishes the reading process of information. Meanwhile, in step S18, when the voltage signal Vm is greater than the reference voltage signal Vref (R>Rth2), NO is determined in step S18. In this case, the comparator 50 outputs the signal (the comparison result) corresponding to information "2" (step S20), and finishes the information reading process.

In the present embodiment, in the manner, the multi-value information recorded on the electric fuse 10 is read. In addition, the reading method of the electric fuse 10 in the present embodiment is not limited to the embodiment mentioned above. As the information reading method of the electric fuse 10, if a method is able to discriminate the resistive state of the filament 1 by the use of two threshold values, an arbitrary method can be used. For example, in the present embodiment, firstly, the first comparison operation is performed by causing the electric current to flow through the first reference resistance 45 and then, the second comparison operation is performed by causing the electric current to flow through the second reference resistance 46. However, the order of the second comparison operation may be reversed.

As described above, in the electric fuse 10 of the present embodiment, and the semiconductor device 60 including the same, it is possible to perform the multi-value recording of three pieces of information on one electric fuse 10, and the multi-value information can be read. Accordingly, in the present embodiment, it is possible to increase the capacity of the electric fuse 10 mounted on the chip, without increasing the mounting area of the electric fuse 10, for example, on the chip of a semiconductor integrated circuit or the like, whereby the above-mentioned problem of the area increase can be solved. In addition, in the electric fuse 10 of the present embodiment, since the multi-value recording of information can be performed, the cell size of the electric fuse 10 per piece of information can be reduced compared to the electric fuse of the related art on which only binary information can be recorded. That is, in the present embodiment, it is possible to effectively increase the capacity of the electric fuse 10 mounted on, for example, the chip of the semiconductor integrated circuit or the like, in a space-saving manner.

Furthermore, since the multi-value recording of information can be performed in the electric fuse 10 of the present embodiment, it is possible to reduce an area of a peripheral circuit of the electric circuit 10, for example, such as a decoder.

In addition, since the electric fuse 10 can be produced by the same process as that of the related art in the present embodiment, there is no necessary to alter the process and newly add the process. Thus, in the present embodiment, it is also possible to solve the problem of the increase in cost mentioned above.

6. Information Rewriting Method of Electric Fuse

In the electric fuse 10 of the present embodiment, and the semiconductor device 60 including the same, in addition to the advantages mentioned above, the following advantages are also obtained.

In the present embodiment, as described above, by changing the blow condition of the electric fuse 10, the resistive state of the filament 1 can be set to anyone of three states (the initial state, the salicide EM state, and the polysilicon damage state). Accordingly, it is also possible to perform the blowing on the filament 1, which is in the salicide EM state (the first resistive state), again, and alter the state of the filament 1 to the polysilicon damage state (the second resistive state). That is, in the present embodiment, the multi-value recording of information can be performed on the electric fuse 10, and the rewriting of information of the electric fuse 10 is also possible.

Figure 15:
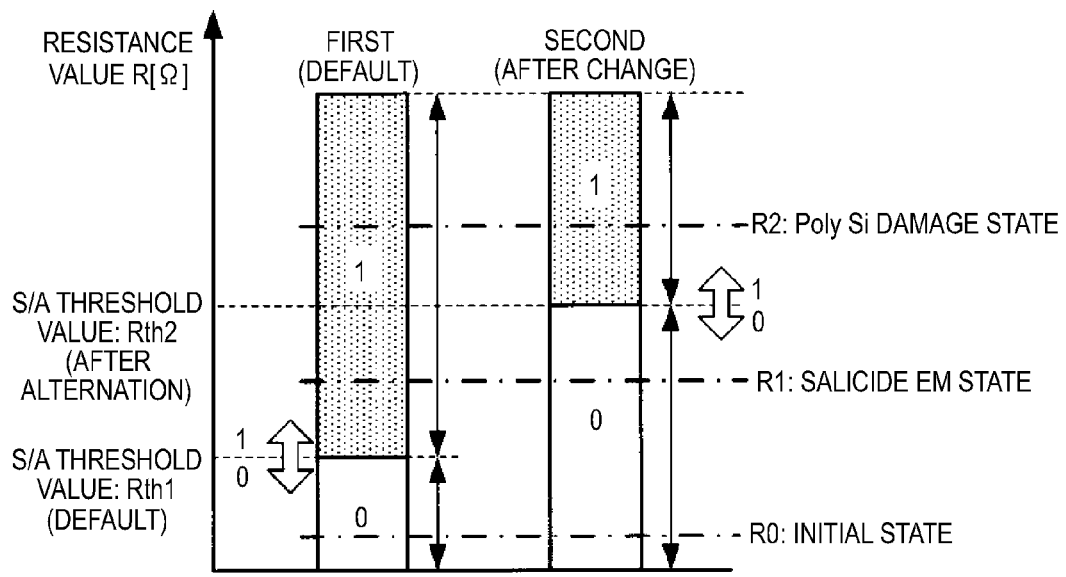
FIG. 15 is a diagram for describing a rewriting method of information.

FIG. 15 shows a summary of the rewriting process of information in the electric fuse 10 of the present embodiment. FIG. 15 shows a discrimination form ("a first (Default)" in FIG. 15) between information "1" and "0" before the rewriting of information, and a discrimination form ("a second (after the alteration)" in FIG. 15) between information "1" and "0" after the rewriting of information.

In the present embodiment, firstly, the filament 1 is caused to enter the salicide EM state by the first blowing to the electric fuse 10, and information "1" is recorded on the electric fuse 10. As a result, the state of the electric fuse 10 before the rewriting of information is generated.

In this state, like the reading process of the multi-value recording information mentioned above, the semiconductor device 60 uses the first threshold value Rth1 (for example, about 1,000Ω) as a threshold value for discriminating between information "0" and information "1" (a discrimination form of "first (default)" in FIG. 15).

Next, re (second)-blowing is performed on the electric fuse 10 which is in the salicide EM state, and the filament 1 is caused to enter the polysilicon damage state. As a result, the state of the electric fuse 10 after the rewriting of information is generated.

Moreover, in this state, the semiconductor device 60 alters the threshold value for discriminating between information "0" and information "1" from the first threshold value Rth1 to the second threshold value Rth2 (for example, about 5,000Ω) (a "second (after the alteration) discrimination form in FIG. 15). That is, after the rewriting the information, the semiconductor device 60 alters the threshold value of the comparator 50 such that the resistive state (the salicide EM state) of the filament 1 before the rewriting (after the first blowing) can be discriminated as information "0".

In the present embodiment, in this manner, the rewriting of information can be performed on the electric fuse 10. In addition, in the present embodiment, among the plurality of electric fuses 10 mounted on, for example, the chip of the semiconductor integrated circuit or the like, a part thereof may be used as the electric fuse of the multi-value recording exclusive use, and the remaining thereof may be used as the electric fuse of the rewriting exclusive use.

7. Various Modified Examples

(1) First Modified Example

In the embodiments mentioned above, an example has been described in which the resistive state of the filament 1 is changed by altering the blow voltage Vblow and/or the blow time Tblow to be applied to the gate of the blow transistor 21. However, the present disclosure is not limited thereto, but if a method is able to blow the filament 1 of the electric fuse 10 in the some resistive states of the salicide EM state and the polysilicon damage state, any method can be used. An example thereof (a modified example) is shown in FIGS. 16 and 17.

Figure 16:
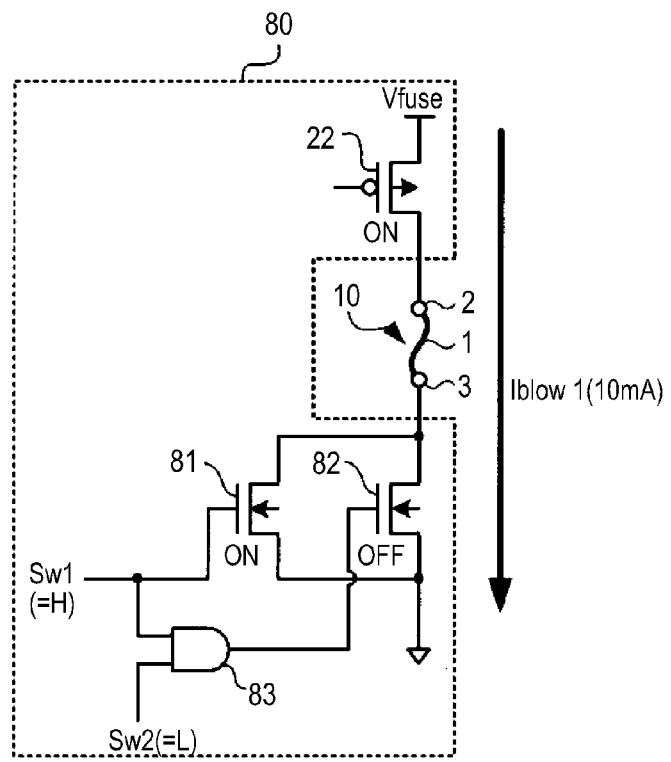
FIG. 16 is a diagram for describing an information writing method of a first modified example.
Figure 17:
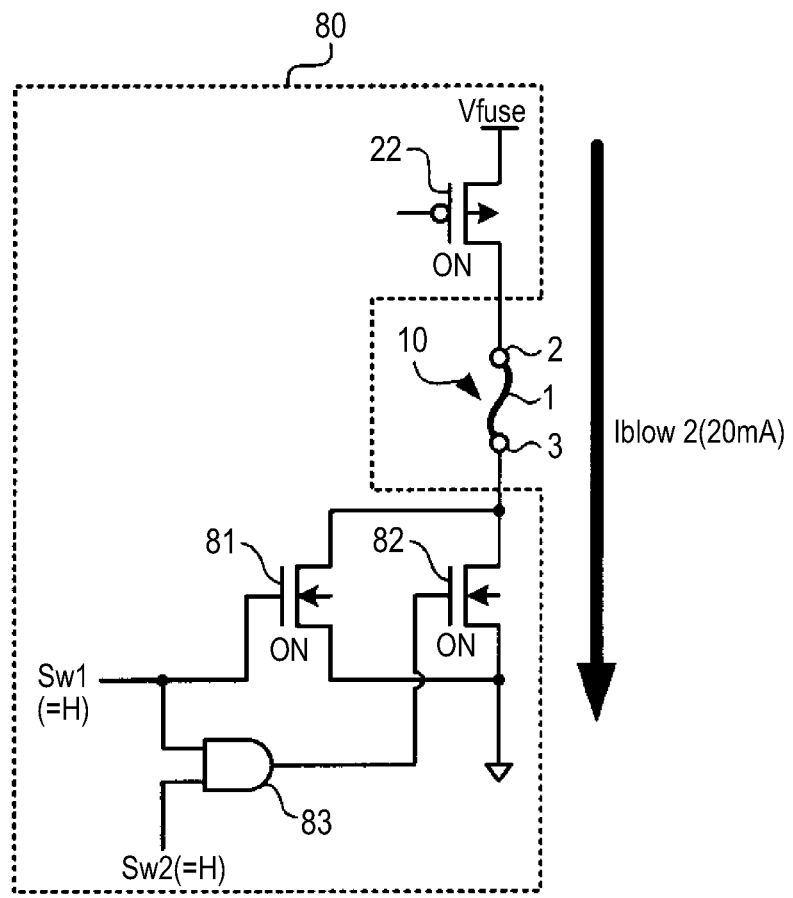
FIG. 17 is a diagram for describing an information writing method of the first modified example.

FIGS. 16 and 17 are circuit configuration diagrams of a writing circuit 80 of a first modified example. In addition, FIG. 16 shows an operation of the writing circuit 80 when causing the first blow electric current Iblow1 (for example, about 10 mA) for setting the filament 1 to the salicide EM state to flow through the electric fuse 10. Furthermore, FIG. 17 shows an operation of the writing circuit 80 when causing the second blow Iblow2 (for example, about 20 mA) for setting the filament 1 to the polysilicon damage state to flow through the electric fuse 10. However, in the writing circuit 80 shown in FIGS. 16 and 17, the same configurations as those of the writing circuit 20 shown in FIG. 10 are denoted by the same reference numerals.

The writing circuit 80 of the first modified example includes the writing switch element 22, a first blow transistor 81, a second blow transistor 82, and an AND 83. In addition, the writing switch element 22 has the same configuration as that of the writing switch element used in the embodiment mentioned above, and thus, the description of the configuration will be omitted.

The first blow transistor 81 and the second blow transistor 82 include an N type MOS transistor, and are provided in parallel between the cathode 3 and the grand of the electric fuse 10. Furthermore, the gate of the first blow transistor 81 is connected to the input terminal of the control signal Sw1, and the gate of the second blow transistor 82 is connected to the output terminal of the AND circuit 83. Furthermore, one input terminal of the AND circuit 83 is connected to the input terminal of the control signal Sw1, and the other input terminal thereof is connected to the input terminal of the control signal Sw2.

In addition, in the present example, the voltage applied to each gate of the first blow transistor 81 and the second blow transistor 82 are constant (a predetermined voltage value). Moreover, in the example, the configuration (for example, a channel size and the like) of the first blow transistor 81 is set such that the first blow electric current Iblow1 flows through the filament 1 when only the first blow transistor 81 is in the ON state. In addition, in the example, the configuration (for example, the channel size and the like) of the second blow transistor 82 is set such that the second blow electric current Iblow2 flows through the filament 1 when both of the first blow transistor 81 and the second blow transistor 82 are in the ON state.

When writing information "1" on the electric fuse 10 (when setting the filament 1 to the salicide EM state) by the use of the writing circuit 80 of the configuration as mentioned above, the writing switch element 22 and the first blow transistor 81 enter the ON state. Furthermore, in the example, as shown in FIG. 16, the control signal Sw2 of Low level is input to the other input terminal of the AND circuit 83. As a result, the signal of Low level is input to the gate from the AND circuit 83 to the second blow transistor 82, and the second blow transistor 82 enters the OFF state.

In this case, the blow electric current flows only through the first blow transistor 81, and as shown in FIG. 16, the first blow electric current Iblow1 (for example, about 10 mA) setting the filament 1 to the salicide EM state flows through the electric fuse 10. As a consequence, information "1" is recorded on the electric fuse 10.

Furthermore, in the writing circuit 80 of the configuration as mentioned above, when writing information "2" on the electric fuse 10 (when setting the filament 1 to the polysilicon damage state), the writing switch element 22 and the first blow transistor 81 enter the ON state. Furthermore, at this time, in the example, as shown in FIG. 17, the control signal Sw2 of High level is input to the other input terminal of the AND circuit 83. As a result, the signal of High level is input from the AND circuit 83 to the gate of the second blow transistor 82, and the second blow transistor 82 enters the ON state.

In this case, the electric current flows through both of the first blow transistor 81 and the second blow transistor 82, and as shown in FIG. 17, the second blow electric current Iblow2 (for example, about 20 mA) setting the filament 1 to the polysilicon damage state flows through the electric fuse 10. As a consequence, information "2" is recorded on the electric fuse 10.

As described above, in the example, the blow condition of the filament 1 is set by the ON/OFF state of the first blow transistor 81 and the second blow transistor 82. In addition, even if the configuration of the writing circuit 80 of the present example is used, like the embodiment mentioned above, the multi-value recording of information can be performed on the electric fuse 10, and thus, the same effect as that of the embodiment mentioned above is obtained.

(2) Second Modified Example

As another method of changing the blow electric current Iblow, for example, a method (a second modified example) of changing the writing voltage Vfuse to be applied to the electric fuse 10 may be used. That is, the blow condition of the filament 1 may be set to the writing voltage Vfuse to be applied to the electric fuse 10.

Figure 18:
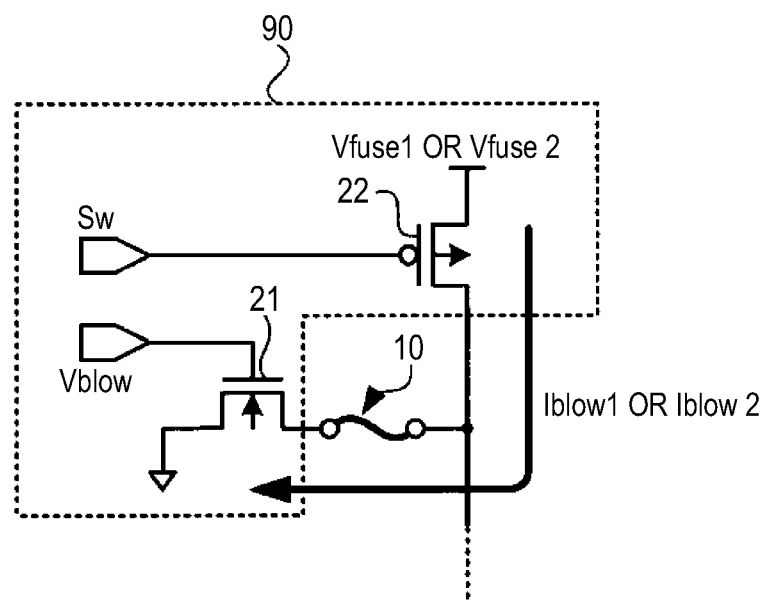
FIG. 18 is a diagram for describing an information writing method of a second modified example.

FIG. 18 shows one configuration example thereof. FIG. 18 shows an operation of the writing method of the example. In addition, in a writing circuit 90 shown in FIG. 18, the same configurations as those of the writing circuit 20 shown in FIG. 10 will be denoted by the same reference numerals.

As will be apparent from the comparison of FIG. 18 with FIG. 10, the configuration of the writing circuit 90 of the example is the same as that of the writing circuit 20 shown in FIG. 10. However, in the writing circuit 90 of the example, when writing information "1" on the electric fuse 10 (when setting the filament 1 to the salicide EM state), a first writing voltage Vfuse1 of a relatively low voltage is applied to the electric fuse 10. Furthermore, when writing information "2" on the electric fuse 10 (when setting the filament 1 to the polysilicon damage state), a second writing voltage Vfuse2 higher than the first writing voltage Vfuse1 is applied to the electric fuse 10.

In addition, the conversion control of the writing voltage Vfuse is performed, for example, by a control section (not shown) or the like in the semiconductor device. As described above, even when using the method of the present example, the multi-value recording of information can be performed on the electric fuse 10, and the same effect as that of the embodiment mentioned above is obtained.

In addition, a method of altering the blow condition, the method of the present example, the method of the embodiment mentioned above (the method of altering the blow voltage Vblow and/or the blow time Tblow), and the method of the first modified example (the method of switching the plurality of blow transistors) may suitably be combined with each other.

8. Configuration Example of Electric Fuse According to Second Embodiment

In the second embodiment, a configuration of an electric fuse will be described which can be blown by the blow electric current Iblow (the blow voltage Vblow and/or the blow time Tblow) lower than the electric fuse 10 of the first embodiment.

(1) Configuration of Electric Fuse

Figure 19:
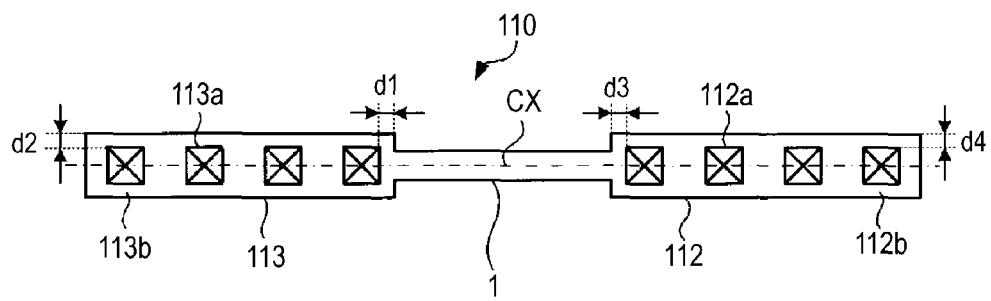
FIG. 19 is a schematic top view of an electric fuse according to a second embodiment of the present disclosure.

FIG. 19 shows a schematic top view of the electric fuse according to the second embodiment of the present disclosure. In addition, FIG. 19 shows a layout of an electric fuse 110 of the one cell. Furthermore, in the electric fuse 110 shown in FIG. 19, the same configuration as that of the electric fuse 10 of the first embodiment shown in FIG. 1 will be denoted by the same reference numeral.

The electric fuse 110 of the present embodiment includes the filament 1, an anode 112, and a cathode 113. In the present embodiment, in the extending direction of the filament 1, the anode 112 is provided in one end portion of the filament 1, and the cathode 113 is provided in the other end portion of the filament 1. As will be apparent from the comparison of the electric fuse 110 of the present embodiment shown in FIG. 19 with the electric fuse 10 of the first embodiment shown in FIG. 1, in the present embodiment, the configurations of the anode 112 and the cathode 113 (both electrodes) are different from those of the anode 2 and the cathode 3 of the first embodiment.

In addition, the configuration of the filament 1 in the electric fuse 110 of the present embodiment is the same as that of the first embodiment shown in FIGS. 1 and 2, and thus the description of the configuration of the filament 1 will be omitted herein. Furthermore, in the present embodiment, as shown in FIG. 19, the anode 112 and the cathode 113 have the same configuration each other, and both electrodes are configured such that the configurations (the shape, the arrangement form of the contact or the like) of the cathode 113 and the anode 112 are symmetric with respect to the filament 1. In addition, since the anode 112 and the cathode 113 have the same configuration each other, only the configuration of the cathode 113 will be described herein.

The cathode 113 is formed of an electrode film having a rectangular film surface shape, a long side portion thereof is extended in a direction along the extending direction of the filament 1. Furthermore, in the present embodiment, a width of the cathode 113 in the width direction of the filament 1 is wider than the width of the filament 1. In addition, a plurality of contacts 113a formed of, for example, a via (a pit wiring) or the like are connected to the cathode 113 (four contacts 113a are connected in the example shown in FIG. 19). The cathode 113 is electrically connected to a wiring layer (an external wiring) (not shown in FIG. 19) via the contacts 113a.

In addition, in the example shown in FIG. 19, the film surface shape of the anode 112 and the cathode 113 were the rectangular form, but the present disclosure is not limited thereto, the film surface shape of each electrode can be arbitrarily set, for example, depending on the size, the number or the like of the forming region of the electric fuse 110. In addition, in the example shown in FIG. 19, an example has been shown in which the respective four contacts of the anode 112 and the cathode 113 are connected, but the present disclosure is not limited thereto. The number of the contact provided in the electric fuse 110 of the one cell can arbitrarily set, for example, depending on the configuration of the wiring layer, the size of the forming region of the electric fuse 110 or the like.

In the example shown in FIG. 19, four contacts 113a are placed in a row at equal intervals along the extending direction (the extending direction of the filament 1) of the cathode 113. At this time, in the present embodiment, connection positions of four contacts 113a are placed on a line (hereinafter, referred to as on a center line CX) extending in a direction along the extending direction of the filament 1 through the center of the filament 1 in the width direction.

In addition, in the example shown in FIG. 19, in order to more clarify the characteristics of the electric fuse 110 of the present embodiment, an example has been described in which the connection position of the contact 113a is placed immediately above the center line CX, but the present disclosure is not limited thereto. In the present embodiment, for example, in the range of the positioning accuracy of the contact 113a, the connection position of the contact 113a may deviate from the center line CX. That is, the expression that the connection position of the contact is placed on the "center line CX" in the present specification is a meaning also including a case where the connection position of the contact is placed on "approximately the center line CX".

In addition, in the present embodiment, the connection position of the contact 113a is placed such that the condition as below is satisfied. Firstly, among the four contacts 113a, a distance between the filament 1 side end portion of the contact 113a situated at the most filament 1 side and the connection section between the filament 1 and the cathode 113, that is, a shortest distance between the filament 1 and the contact 113a is set to d1. Furthermore, a distance between the long side portion of the cathode 113 and the end portion of the contact 113a facing that, that is, a width (a fringe width) of a fringe section 113b of the cathode 113 is set to d2. Moreover, in the present embodiment, the shortest distance d1 (the shortest distance between the filament side end portion of the contact 113a and the connection portion between the filament 1 and the cathode 113) is set to the same value as the fringe width d2.

In addition, in the present embodiment, as described above, the configuration of the anode 112 is symmetrical to the configuration of the cathode 113 with respect to the filament 1. Accordingly, in the present embodiment, a shortest distance d3 between the filament 1 and the contact 112a in the anode 112 is also set to the same value as a width d4 of the fringe section 112b of the anode 112.

However, in the present embodiment, as described above, the connection position of the contact may deviate from, for example, the center line CX in the range of the positioning accuracy of the contact. Accordingly, in the present embodiment, the shortest distances (d1 and d3) between the filament and the contact may be different from the fringe widths (d2 and d4) in the range of the positioning accuracy of the contact. That is, in the specification, the expression that the shortest distances (d1 and d3) between the filament and the contact are "equal to" the fringe widths (d2 and d4) is a meaning which also includes a case were values of both are "approximately the same".

The shortest distances (d1 and d3) between the filament and the contact, that is, the fringe widths (d2 and d4) are suitably set, for example, depending on a design rule and a process generation, and, for example, can be set to about 50 nm. Furthermore, in the present embodiment, particularly, the shortest distance d1 between the filament 1 and the contact 113a in the cathode 113 is suitably set in view of the blow condition (the blow electric current Iblow). As described below, in order to blow the filament 1 by the low blow electric current, it is necessary to reduce an influence of an ID drop (a voltage drop) generated in a region reaching from the contact 113a situated at the most filament 1 side in the cathode 113 to the filament 1. For this reason, it is preferable to more shorten the shortest distance d1 between the filament 1 and the contact 113a. Thus, in the present embodiment, when the width d2 of the fringe section 113b is set to, for example, a minimum size defined by the design rule, the shortest distance d1 between the filament 1 and the contact 113a also becomes the minimum value. In this case, it is possible to considerably reduce the influence of the IR drop (the voltage drop) mentioned above.

In addition, as described above, the filament 1 of the electric fuse 110 of the present embodiment has the same configuration as that of the first embodiment. Accordingly, the electric fuse 110 of the present embodiment can be applied to the writing circuit 20 (FIG. 8) and the semiconductor device 60 (FIG. 10) mentioned above, and in the same manner as the first embodiment, the writing (the multi-value recording) and reading of information can be performed. In addition, it is possible to apply the techniques of various modified examples mentioned above to the electric fuse 110 of the present embodiment.

(2) Reduction Principle of Blow Electric Current Iblow

Figure 20A:
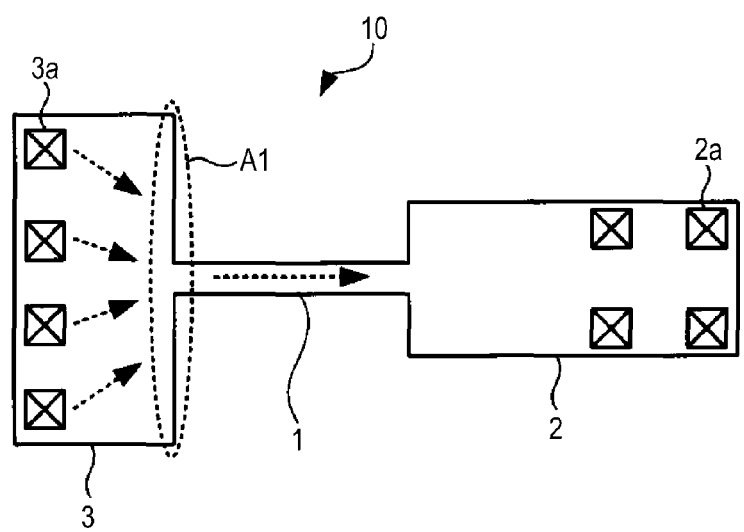
FIGS. 20A and 20B are diagrams for comparing the electric fuse according to the first embodiment to the electric fuse according to the second embodiment.
Figure 20B:
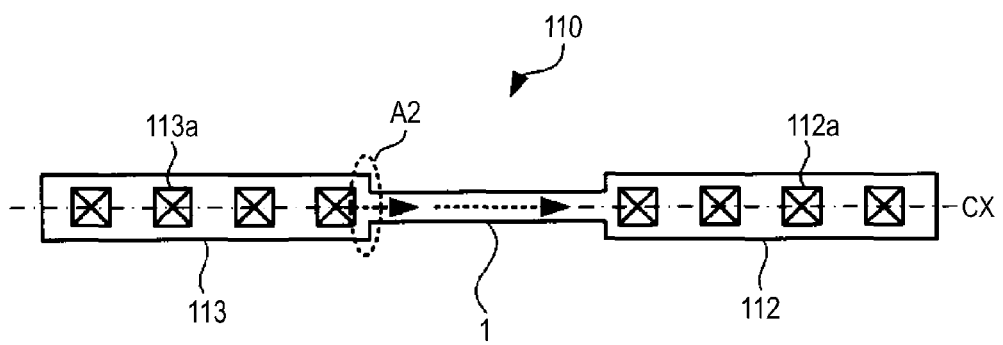
Figure 21:
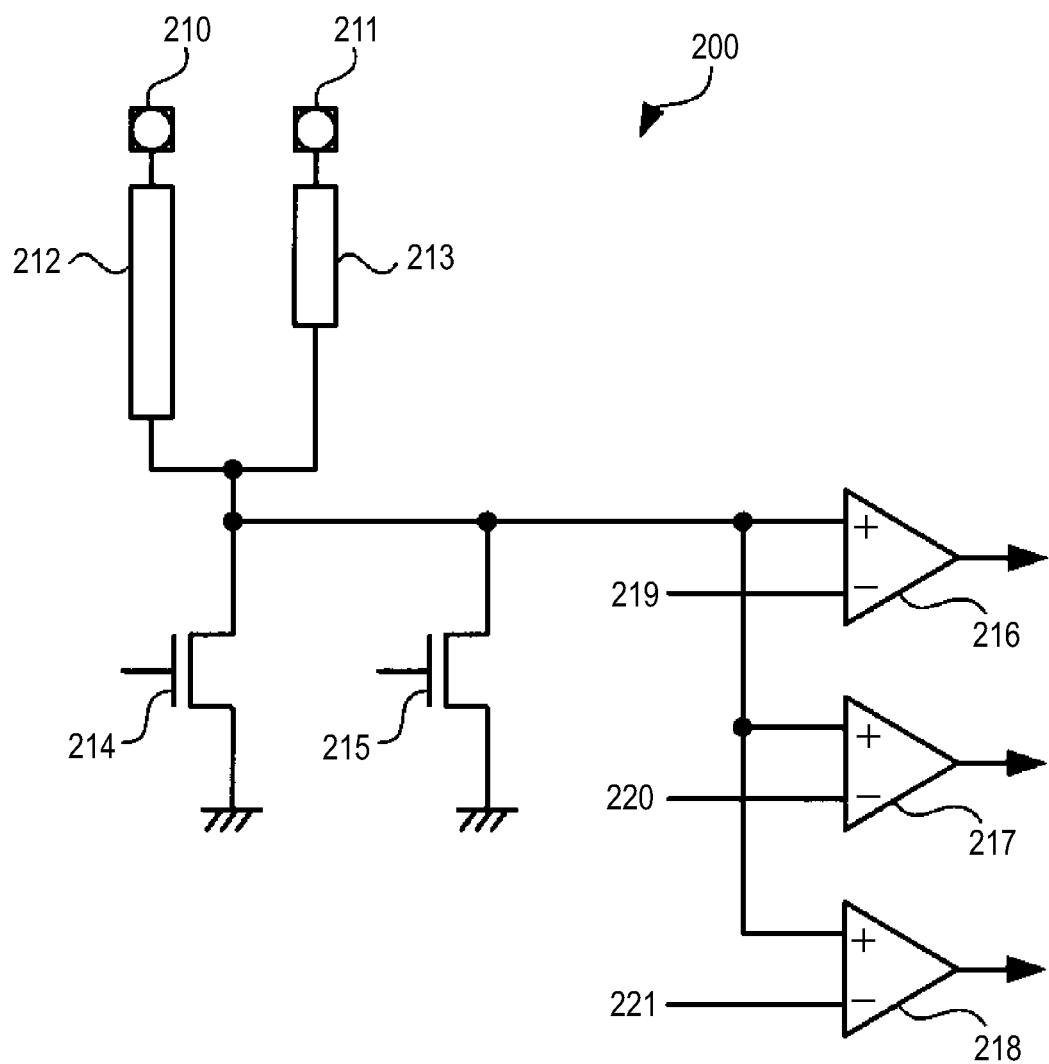
FIG. 21 is a schematic configuration diagram of an electric fuse module of the related art.

Next, in the electric fuse 110 of the present embodiment, the principle capable of reducing the blow electric current Iblow during blowing will be described with reference to FIGS. 4A 4B, 5A, 5B, 20A and 20B. In addition, FIG. 20A is a diagram that shows how an electron (a dotted arrow) flows through the electric fuse 10 during blowing, in the electric fuse 10 according to the first embodiment. Furthermore, FIG. 20B is a diagram that shows the electron (a dotted arrow) flowing through the electric fuse 110 during blowing in the electric fuse 110 according to the present embodiment.

As described above, in the electric fuse according to the present disclosure, when setting the resistive state of the filament 1 to the salicide EM state or the polysilicon damage state, the silicide layer 5 of the filament 1 is dissolved by the blow electric current Iblow (the silicide layer 5 is washed away by the flow of the electron). However, at this time, as shown in FIGS. 4A and 5A, in addition to the filament 1, the silicide layer 5 of a part (a hatched region) of the region of the filament 1 side of the cathode 3 is also dissolved by the blow electric current Iblow. Since the polysilicon later 4 is exposed to the region in the cathode 3 where the silicide layer 5 is dissolved, the resistance value of the region is greater than the resistance value before the blowing (a parasitic resistance is generated).

In the electric fuse in which a high resistance region is generated in a part of the cathode during blowing, when performing the information recording on the filament by the low blow electric current, there is also a possibility that, if the IR drop in the high resistance region is great, it is difficult to apply a desired blow voltage to the filament. In this case, it is difficult to record desired information on the filament. Accordingly, when performing the information recording on the filament by the low electric current, it is desirable to further reduce the IR drop in the high resistance region in the cathode. Thus, in the present embodiment, the influence of the ID drop mentioned above is reduced by reducing the area of the high resistance region in the cathode generated during blowing.

Specifically, in the electric fuse 10 of the first embodiment, as shown in FIG. 20A, the arrangement positions of four contacts 3a connected to the cathode 3 are placed in a row along the width direction of the filament 1. Accordingly, in the electric fuse 10 of the first embodiment, a path width (a path width of the blow electric current Iblow flowing from the filament 1 into the contact 3a) of the electron flowing from the contact 3a into the filament 1 is relatively increased.

On the contrary, in the electric fuse 110 of the present embodiment, as shown in FIG. 20B, the connection positions of four contacts 113a connected to the cathode 113 are placed on the center line CX of the filament 1. In this case, as shown in FIG. 20B, a direction of the electron (the blow electric current Iblow flowing from the filament 1 into the contact 113a) flowing from the cathode 113 into the filament 1 is mainly the extending direction of the filament 1. Furthermore, as shown in FIGS. 20A and 20B, the width of the cathode 113 in the connection section (the region A2) between the cathode 113 and the filament 1 of the present embodiment is narrower than the width of the cathode 3 in the connection section (the region A1) between the cathode 3 and the filament 1 of the first embodiment.

Accordingly, in the electric fuse 110 of the present embodiment, it is possible to make the path width (the path width of the blow electric current Iblow flowing from the filament 1 into the contact 113a) of the electron flowing from the contact 113a into the filament 1 smaller than that of the first embodiment. That is, in the present embodiment, it is possible to narrow the path of the electron flowing from the cathode 113 into the filament 1, compared to the first embodiment. As a result, it is possible to reduce the area of the high resistance region in the cathode 113 generated during blowing.

In addition, in the electric fuse 110 of the present embodiment, as described above, the shortest distance d1 between the filament 1 and the contact 113a is set to the same value as the width d2 of the fringe section 113b of the cathode 113. As a result, in the present embodiment, the distance between the contact 113a situated at the most filament 1 side and the connection section between the filament 1 and the cathode 113 is further reduced.

Accordingly, in the present embodiment, it is also possible to shorten the path length (the path length of the blow electric current Iblow flowing from the filament 1 into the contact 113a) of the electron flowing from the contact 113a into the filament 1 compared to that of the first embodiment. As a result, in the present embodiment, it is possible to further reduce the area of the high resistance region in the cathode 113 generated during blowing.

As described above, in the electric fuse 110 of the present embodiment, it is possible to further reduce the area of the high resistance region in the cathode 113 generated during blowing, compared to the first embodiment. In this case, it is possible to reduce the influence of the IR drop in the high resistance region when the filament 1 is blown, whereby it is possible to set the resistive state of the filament 1 to the salicide EM state or the polysilicon damage state by the smaller blow electric current Iblow.

In addition, as will be apparent from the principle mentioned above, in the present embodiment, since the area of the high resistance region in the cathode 113 generated during blowing may be reduced, the condition of the connection position of the contact 113a may be satisfied at least only in the cathode 113. In addition, in the present embodiment, a case has been described in which the shortest distance d1 between the filament 1 and the contact 113a is set to the same value as the fringe width d2, but the present disclosure is not limited thereto, and both of them may be different from each other. In this case, the shortest distance d1 between the filament 1 and the contact 113a may be set to the value which can sufficiently reduce the influence of the IR drop in the high resistance region in the cathode 113.

(3) Verification Example

Herein, a comparison result of the second blow electric current Iblow2 for generating the polysilicon damage state measured in each sample of the electric fuse 10 of the first embodiment and the electric fuse 110 of the present embodiment produced actually is shown in Table 2 as below. In addition, herein, in both sample, the configurations of each sample are set such that the resistance values of the polysilicon damage state are substantially equal to each other.

TABLE 2

|  | first embodiment | second embodiment |
|---|---|---|
| Iblow2 | 15 mA | 10 mA |

As will be apparent from Table 2, in the present embodiment, it is noted that the second blow electric current Iblow2 drops compared to the first embodiment. In addition, in the electric fuse 110 of the present embodiment, since the configuration of the filament 1 is the same as that of the first embodiment, the change characteristics of the resistance value R of the filament 1 to the blow condition are the same as the characteristics described in FIGS. 6. Accordingly, the comparison result of the first blow electric current Iblow1 for setting the filament 1 to the salicide EM state is not shown herein, however, from the principle mentioned above, it is assumed that the first blow electric current Iblow1 in the present embodiment is also lower than that of the first embodiment.

(4) Various Effects

In the electric fuse 110 of the present embodiment of the configuration mentioned above, various effects as below are obtained.

The filament 1 of the electric fuse 110 of the present embodiment has the same configuration as that of the first embodiment. In addition, in the electric fuse 110 of the present embodiment, in the same manner as the first embodiment, the writing and the reading of information can be performed. Accordingly, in the present embodiment, the same effect as that of the first embodiment is obtained.

Furthermore, in the electric fuse 110 of the present embodiment, as described above, since the area of the high resistance region in the cathode 113 generated during blowing can be reduced, it is possible to set the filament 1 to a desired resistive state (record a desired information) by the low blow electric current.

Furthermore, in the present embodiment, since it is possible to reduce the influence of the IR drop in the high resistance region in the cathode 113 generated during blowing, it is possible to improve the respective resistive states, particularly, the variation of the low blow voltage side state (the salicide EM state), as compared to the first embodiment.

Furthermore, in the present embodiment, as shown in FIGS. 20A and 20B, since the areas of the anode 112 and the cathode 113 can be reduced compared to the first embodiment, an occupation area per one cell of the electric fuse 110 can be reduced. For example, according to the validation of proponents and the like of the technology, it is possible to reduce the occupation area per one cell of the electric fuse 110 by about 50% compared to the first embodiment.

In addition, in the present embodiment, since the blow electric current Iblow can be reduced, it is also possible to reduce the transistor size of the blow transistor (see FIG. 8) which supplies the filament 1 with the blow electric current Iblow. That is, in the present embodiment, it is possible to reduce the area of the peripheral circuit element as well as the electric fuse 110. For example, according to the validation of the proponents and the like of the technology, it is possible to reduce the occupation area of the circuit section including the electric fuse 110 and the peripheral circuit element thereof (for example, the blow transistor, the sensor or the like) by about 30% compared to the first embodiment. Accordingly, in the configuration of the present embodiment, for example, it is possible to further increase the capacity of the electric fuse 110 mounted on the chip of the semiconductor integrated circuit and the like.

Furthermore, in the electric fuse 110 of the present embodiment, the shapes of each electrode (the anode 112 or the cathode 113) are symmetrical to the filament 1, and the widths of each electrode in the filament 1 in the width direction are narrower than those of the first embodiment. By such a configuration of the electric fuse 110, the effect as below is also obtained.

For simplifying the specification, FIGS. 20A and 20B show an example in which the side portions of each electrode and the long side portion of the filament 1 are connected to each other by an angle of 90° in the connection section between each electrode and the filament 1. However, in the electric fuse produced actually, the shape of the connection section does not become such a shape. When producing the electric fuse 110 by a general patterning process, commonly, the shape of the connection section becomes a shape in which the pattern width (the width of the filament 1) becomes gradually narrower from each electrode toward the filament 1. The wider the width of each electrode in the width direction of the filament 1 is, the longer a length in the extending direction of the filament 1 of the region with the gradually narrowed pattern width is.

Accordingly, in the electric fuse 110 of the present embodiment, since the width of each electrode in the width direction of the filament 1 is narrower than that of the first embodiment, the length of the region, where the pattern with becomes narrower from each electrode toward the filament 1, is also shortened. In this case, it is possible to reduce the manufacturing irregularity of the pattern shape of the electric fuse 110, whereby it is possible to stably manufacture the electric fuse 110 having a desired capability.

The present disclosure may be implemented as the following configurations.

(1) An electric fuse which includes a filament having a first conductive layer and a second conductive layer formed on the first conductive layer in which at least three discernible resistive states are generated by changing of a combination of a state of the first conductive layer and a state of the second conductive layer.

(2) The electric fuse described in (1) wherein the first conductive layer is formed of polysilicon, and the second conductive layer is formed of silicide.

(3) The electric fuse described in (1) or (2) wherein at least three discernible resistive states of the filament include an initial state, a state where a salicide EM is generated in the filament, and a state where damage is generated in the first conductive layer.

(4) The electric fuse described in any one (1) to (3) wherein the resistive state of the filament is changed by a blow condition of the filament.

(5) The electric fuse described in (4) wherein a threshold value level for discriminating the resistive state of the filament is also changed when further blowing the filament which is in a first resistive state other than the initial state to change the filament to a second resistive state.

(6) The electric fuse described in any one (1) to (5) further includes a cathode provided in one end portion of the filament in an extending direction of the filament, wherein a connection position in the cathode of a contact for electrically connecting the cathode and an external wiring is placed on a line extended in a direction along the extending direction of the filament through a center of a width direction of the filament.

(7) The electric fuse described in (6) wherein a plurality of contacts are connected to the cathode, and connection positions of the plurality of the contacts are placed on the line.

(8) The electric fuse described in (6) or (7) wherein a shortest distance between a filament side end portion of the contact and a connection section between the filament and the cathode is the same as a fringe width of the cathode.

(9) The electric fuse described in any one (6) to (8) further includes an anode which is provide in the other end portion of the filament in the extending direction of the filament, wherein a connection position in the anode of the contact for electrically connecting the anode and the external wiring is placed on the line.

(10) A semiconductor device includes an electric fuse which has a filament including a first conductive layer and a second conductive layer formed on the first conductive layer in which at least three discernible resistive states are generated by changing a combination of a state of the first conductive layer and a state of the second conductive layer;

a writing section which generates at least three discernible resistive states for the electric fuse;

a reading section which reads a signal concerning the resistance value of the electric fuse;

a threshold value signal generating section which generates a threshold value signal for discriminating the resistive state of the electric fuse; and a discrimination section which compares a signal concerning the resistance value of the filament read by the reading section to the threshold value signal generated in the threshold value signal generating section, and discriminates the resistive state of the electric fuse.

(11) A semiconductor device which includes an electric fuse having a filament which includes a first conductive layer and a second conductive layer provided on the first conductive layer; and a writing section which applies a plurality of electric stresses to the filament, and independently changes each resistance value of the first conductive layer and the second conductive layer.

(12) An information writing method of an electric fuse which includes setting a blow condition for generating a predetermined resistive state for an electric fuse which has a filament including a first conductive layer and a second conductive layer formed on the first conductive layer in which at least three discernible resistive states are generated by changing a combination of a state of the first conductive layer and a state of the second conductive layer; and causing electric current to flow through the filament under the set blow condition to generate the predetermined resistive state in the filament.

(13) An information writing method of an electric fuse which includes applying a first electric stress to a filament of an electric fuse having the filament which includes a first conductive layer and a second conductive layer provided on the first conductive layer to change a resistance value of the second conductive layer, or applying a second electric stress greater than the first electric stress to the filament to change a resistance value of the first conductive layer.

The present disclosure contains subject matter related to those disclosed in Japanese Priority Patent Applications JP 2011-066255 and JP 2011-274255 filed in the Japan Patent Office on Mar. 24, 2011 and Dec. 15, 2011, respectively, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
an electric fuse including a filament having a first conductive layer and a second conductive layer on the first conductive layer,
wherein,
the semiconductor device is configured such that at least three discernible resistive states are generated in the filament of the electric fuse by changing of a combination of a state of the first conductive layer and a state of the second conductive layer, the at least three discernible resistive states including an initial state, a first resistive state, and a second resistive state, the semiconductor device being configured (i) to set a first blow condition under which a first electric current is caused to flow through the filament to generate the first resistive state and (ii) to set a second blow condition, different from the first blow condition, under which a second electric current is caused to flow through the filament to generate the second resistive state.

2. The semiconductor device according to claim 1, wherein:
the first conductive layer is formed of polysilicon, and
the second conductive layer is formed of silicide.

3. The semiconductor device according to claim 2, wherein:
in the first resistive state, a salicide EM (Electro Migration) is generated in the filament, and
in the second resistive state, a damage is generated in the first conductive layer.

4. The semiconductor device according to claim 3, wherein in the first resistive state, the salicide EM is generated in the filament but no damage occurs in the first conductive layer.

5. The semiconductor device according to claim 1, wherein:
the electric fuse further comprises a cathode provided in one end portion of the filament in an extending direction of the filament, and
a connection position in the cathode of a contact for electrically connecting the cathode with an external wiring is placed on a line extended in a direction along the extending direction of the filament through a center of the filament in a width direction thereof.

6. The semiconductor device according to claim 5, wherein:
a plurality of contacts are connected to the cathode, and
respective connection positions of the plurality of the contacts are placed on the line.

7. The semiconductor device according to claim 5, wherein a shortest distance between a filament side end portion of the contact and a connection section between the filament and the cathode is the same as a fringe width of the cathode.

8. The semiconductor device according to claim 5, wherein:
the electric fuse further comprises an anode provided in another end portion of the filament in the extending direction of the filament, and
a connection position in the anode of the contact for electrically connecting the anode with the external wiring is placed on the line.

9. The semiconductor device according to claim 1 further comprising:
a writing section that causes the at least three discernible resistive states in the electric fuse;

a reading section that reads a signal associated with a resistance value of the electric fuse;

a control section that provides respective control signals for the writing section and the reading section;

a threshold value signal generating section that generates a threshold value signal for discriminating between the at least three discernible resistive states of the electric fuse; and a discrimination section that compares the signal read by the reading section to the threshold value signal generated by the threshold value signal generating section, and discriminates between the at least three discernible resistive states of the electric fuse.

10. The semiconductor device according to claim 9, wherein the writing section has first and second blow elements provided in parallel to each other and connected to the filament.

11. The semiconductor device according to claim 9, wherein:
the writing section includes a blow transistor,
the first blow condition includes a first blow voltage applied to a gate of the blow transistor, and
the second blow condition includes a second blow voltage, different from the first blow voltage, applied to the gate of the blow transistor.

12. The semiconductor device according to claim 11, wherein each of the first and second blow conditions further includes a respective application time for the duration of which the blow voltage is applied to the gate of the blow transistor.

13. The semiconductor device according to claim 1 further comprising:

a writing section that applies a plurality of electric stresses to the filament to cause the first and second electric currents to flow through the filament.

14. An information writing method of an electric fuse comprising:
setting a first blow condition for generating a first resistive state for an electric fuse that has a filament including a first conductive layer and a second conductive layer on the first conductive layer and in which at least three discernible resistive states including an initial state, the first resistive state, and a second resistive state are generated by changing a combination of a state of the first conductive layer and a state of the second conductive layer;
causing a first electric current to flow through the filament under the set first blow condition to generate the first resistive state in the filament;
setting a second blow condition different from the first blow condition for generating a second resistive state for the electric fuse; and
causing a second electric current to flow through the filament under the set second blow condition to generate the second resistive state in the filament.

15. The method according to claim 14, wherein:
under the set first blow condition, a resistance value of the second conductive layer is changed when the first electric current flows through the filament, and
under the set second blow condition, a resistance value of the first conductive layer is changed when the second electric current flows through the filament, the second electric current being greater than the first electric current.

* * * * *